US006901356B1

(12) United States Patent
Arita

(10) Patent No.: US 6,901,356 B1
(45) Date of Patent: May 31, 2005

(54) SIMULATION APPARATUS, SIMULATION METHOD AND COMPUTER-READABLE RECORDING MEDIUM HAVING SIMULATION PROGRAM RECORDED THEREON AS WELL AS DESIGNING SUPPORTING APPARATUS

(75) Inventor: Yuichi Arita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/268,999

(22) Filed: Mar. 16, 1999

(30) Foreign Application Priority Data

Mar. 20, 1998 (JP) .......................................... 10-072900

(51) Int. Cl.[7] .............................................. G06F 9/455
(52) U.S. Cl. ........................... 703/7; 703/22; 700/178; 700/118; 700/179; 345/653
(58) Field of Search ................... 703/7, 6, 22; 345/653, 345/419, 422, 424, 427, 119; 700/178, 98, 182, 163, 263, 118, 179, 255, 95, 104, 105, 180; 382/103, 106; 425/470; 706/919

(56) References Cited

U.S. PATENT DOCUMENTS

| 4,975,856 A | * | 12/1990 | Vold et al. ................... 700/263 |
| 5,075,866 A | * | 12/1991 | Goto et al. ................... 700/182 |
| 5,106,290 A | * | 4/1992 | Carver et al. ................ 425/470 |
| 5,497,453 A | * | 3/1996 | Megahed et al. ............ 345/422 |
| 5,590,268 A | * | 12/1996 | Doi et al. ..................... 345/848 |
| 5,675,720 A | * | 10/1997 | Sato et al. ................... 345/119 |
| 5,815,400 A | * | 9/1998 | Hirai et al. ................... 700/163 |
| 5,831,875 A | * | 11/1998 | Hirata et al. .................... 703/7 |
| 6,157,902 A | * | 12/2000 | Hirata et al. .................... 703/7 |
| 6,167,142 A | * | 12/2000 | Nozaki ........................ 382/103 |
| 6,205,367 B1 | * | 3/2001 | Arita et al. ..................... 700/98 |
| 6,233,538 B1 | * | 5/2001 | Gupta et al. .................... 703/6 |

FOREIGN PATENT DOCUMENTS

| JP | 7-132428 | 5/1995 |
| JP | 08185431 | 7/1996 |
| JP | 09147166 | 6/1997 |
| JP | 10-240791 | 9/1998 |
| JP | 10312208 | 11/1998 |
| JP | 10334280 | 12/1998 |

OTHER PUBLICATIONS

Siddique, "Conversion of CAD model data for virtual prototypes for Disassembly", Thesis to The Academic faculty for Master of Science in Mechanical Engineering, Georgia Institute of Technology, May 1996.*
Sato et al., "A virtual object manipulation interface for automated assemblt programming", 1994 International conference on System, man and Cybernatics.*
Sato, A et al., "A virtual object manipulation interface for automated assembly programming", 1994 International conference on System, Man and Cybernetics, Oct. 1994.*

* cited by examiner

*Primary Examiner*—Samuel Broda
*Assistant Examiner*—Kandasamy Thangavelu
(74) *Attorney, Agent, or Firm*—Staas & Halsey LLP

(57) ABSTRACT

The invention provides a simulation apparatus by which a problem upon designing can be found in the designing stage on the upstream without imposing an unnecessary working time to a designer. The simulation apparatus includes a working means model information storage section for storing information regarding working means models related to standard part models for working the standard part models, a working means model information extraction section for referring to the working means model information storage section based on information regarding a standard part model arranged in a design model to extract information regarding a working means model to be used to work the standard part model arranged in the design model, and a working simulation execution section for executing a simulation of the working for the standard part model with the working means model based on design information of the design model and the extracted information regarding the working means model, and checks the workability of working for a subject designed in a virtual three-dimensional space on a computer.

26 Claims, 21 Drawing Sheets

F I G. 14
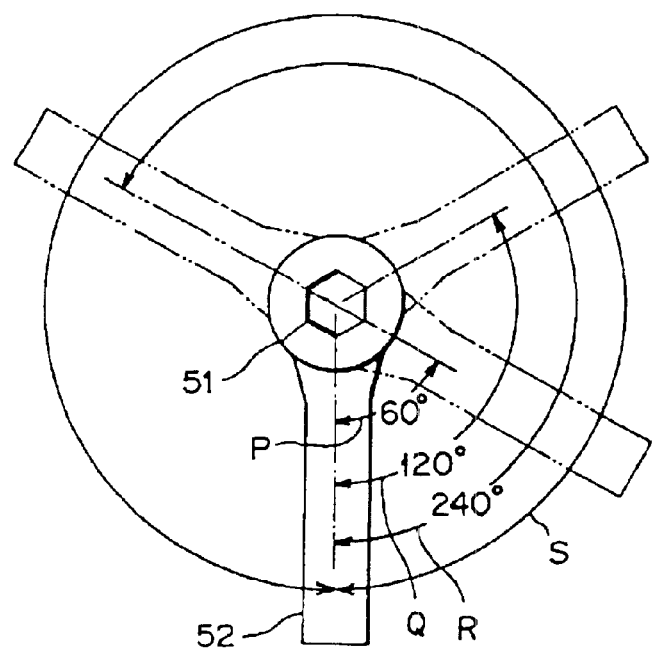
F I G. 15
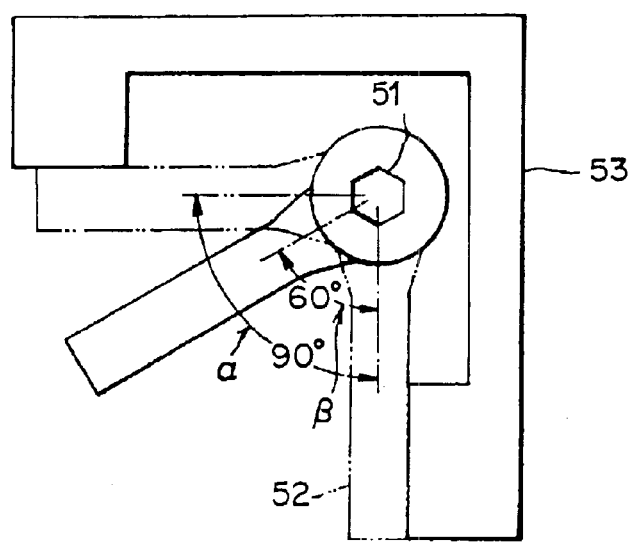

START OF SIMULATION

TOOL APPEARS AND APPROACHES
WHILE INTERFERENCE CHECKING
IS PERFORMED

ARRIVES AT STANDARD PART

WORKING SIMULATION IS PERFORMED

MOVES AWAY

TOOL DISAPPEARS

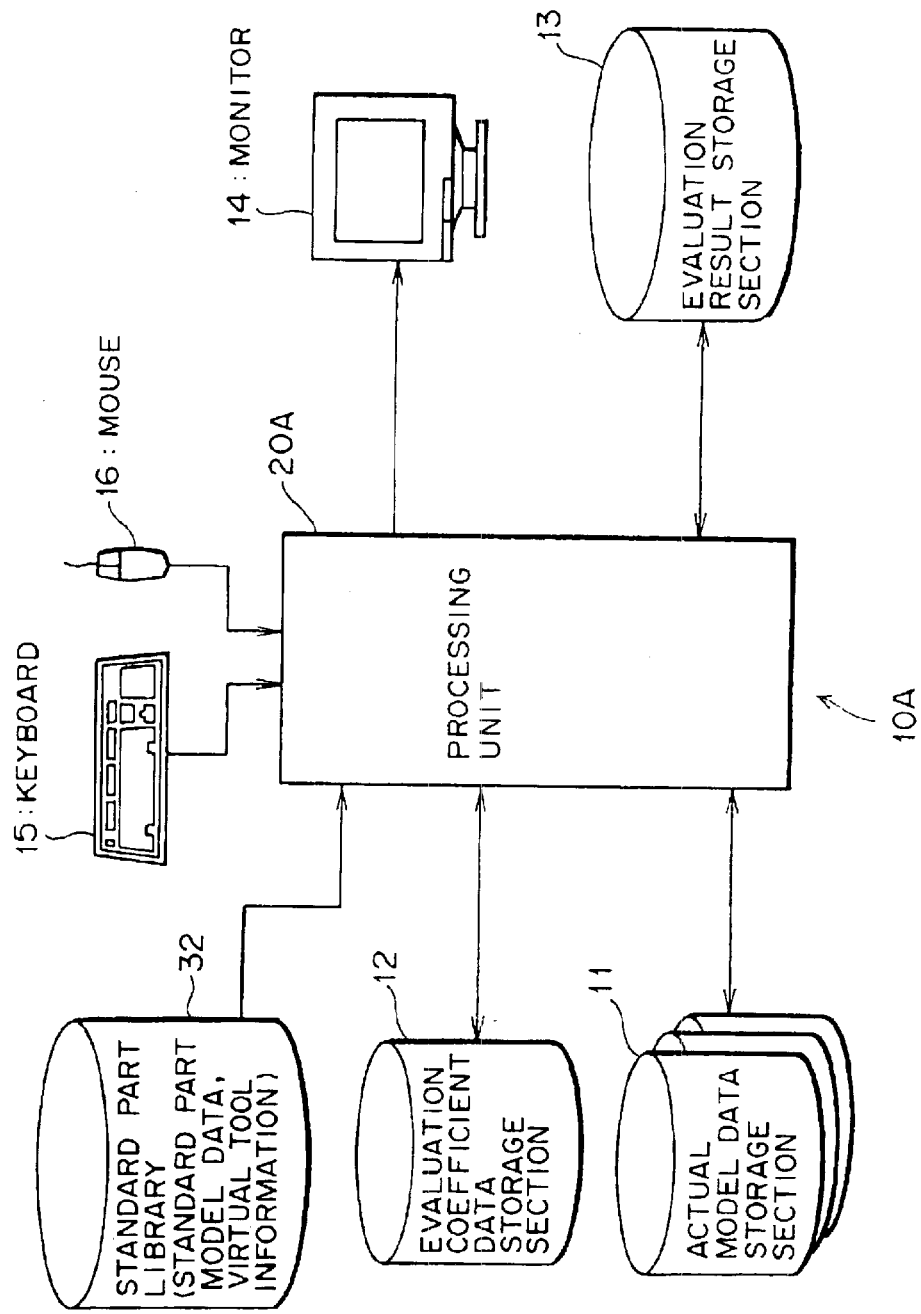

SIMULATION APPARATUS, SIMULATION METHOD AND COMPUTER-READABLE RECORDING MEDIUM HAVING SIMULATION PROGRAM RECORDED THEREON AS WELL AS DESIGNING SUPPORTING APPARATUS

BACKGROUND OF THE INVENTION

1) Field of the Invention

This invention relates to a simulation apparatus, a simulation method and a computer-readable recording medium having a simulation program recorded thereon as well as a designing supporting apparatus suitable for use to check the workability when such working as assembly, disassembly or adjustment is performed for a subject designed by physical or mechanical characterization in a virtual three-dimensional space on a computer.

2) Description of the Related Art

In recent years, as enhancement in performance of a computer for designing equipments and apparatus and popularization of a design technique which employs a three-dimensional CAD (Computer Aided Design) system have proceeded, a technique of performing inspection and examination of a design subject on a computer in a stage preceding to actual trial production of the design subject by constructing environment in which working such as assembly, disassembly or adjustment for the design subject is virtually performed on the computer has been developed in various places.

Production of three-dimensional model data as designing operation in which such a three-dimensional CAD system as mentioned above is utilized usually requires much time, and upon designing, it is sometimes omitted to incorporate such parts as screws which are prescribed as standards as three-dimensional model data. In such an instance, it is sometimes difficult to incorporate omitted parts in the stage of trial production, and this makes a factor which causes a design miss.

Accordingly, upon production of three-dimensional model data mentioned above, it is required as essential working to incorporate such parts as screws which are prescribed as standards. Also it is required to virtually verify it on a computer prior to actual trial production whether or not working for such a part can actually be performed by a working element such as a tool or a hand of a human being.

Thus, a technique is available which provides environment in which a design subject is virtually produced by trial on a computer and allows a tool model or a human being model for performing working to be handled together with the design subject on the computer. By the technique, reviewing can be performed while working to be performed for the design subject is approximated to an actual working manner.

Such techniques which involve verification of handling of a tool to be used to assemble or disassemble an apparatus/equipment in a virtual three-dimensional space on a computer or a human being who performs working as described above are disclosed in Japanese Patent Laid-Open No. 132428/1995, Japanese Patent Laid-Open No. 185431/1996 and Japanese Patent Laid-Open No. 147166/1997.

The technique disclosed in Japanese Patent Laid-Open No. 132428/1995 relates to an equipment assembling process supporting apparatus. According to the technique, steps when assembling and disassembling operations of an apparatus are performed are determined definitely and types of tools to be used for the individual steps and periods of use of the tools are determined definitely such that the same tool is prevented from being used at a plurality of locations within the same period to reduce the quantity of tools to be used for assembly and disassembly of the equipment.

Meanwhile, the technique disclosed in Japanese Patent Laid-Open No. 185431/1996 relates to a designing supporting apparatus. According to the technique, models of parts and tools and/or persons are related to each other using a table for individual design subjects determined for individual assembly lines, and a part name and an assembly line name are inputted to discriminate assembly in which a tool is used or assembly by hand and search for shapes of a tool and a hand or shapes of a part and a hand as elements relating to working whereas a mounting position is inputted to discriminate whether or not assembly is possible from the point of view of human engineering.

The technique disclosed in Japanese Patent Laid-Open No. 147166/1997 relates to an interference checking method and an interference checking apparatus for an assembly tool. According to the technique, all assembling locations of a design subject are detected and tools and metal fittings to be used for assembly are selected based on data outputted from a three-dimensional CAD system, and a list indicating a relationship between the assembly locations and the tools and metal fittings to be used is produced. Then, it is checked whether or not the tools and the parts interfere with each other when the tools are arranged at the assembly locations, and if some trouble occurs, then the assembling order is changed and then checking is performed repetitively.

For example, where the positions of holes formed in two parts which form a design subject are same, the holes are detected as holes to be used for performing assembling operations of the two parts, and tools and metal fittings to be used for such assembly are selected.

However, in such techniques for verification regarding handling of tools to be used and/or human beings who perform working when an apparatus/equipment in a three-dimensional space is to be assembled or disassembled as described above, it is presupposed that they are applied to a subject as a result of completion of designing working, and no verification working is performed in the course of designing (in the designing step on the upstream).

In particular, if such verification is performed for the first time for a result of completed designing, then it is sometimes necessitated to modify the design for a large number of locations. Therefore, there is a subject to be solved in that the working load sometimes becomes higher than that in an alternative case wherein verification is performed in the designing process on the upstream and the designing working is proceeded by suitably modifying the design.

Further, in the technique disclosed in Japanese Patent Laid-Open No. 132428/1995, a complicated setting work of relating models of parts and tools and/or human beings to each other in accordance with steps of each design subject must be performed in the designing stage by a designer. Accordingly, the technique disclosed in Japanese Patent Laid-Open No. 132428/1995 has a subject to be solved also in that an unnecessary working time is assigned to a designer.

Also in the technique disclosed in Japanese Patent Laid-Open No. 185431/1996, a complicated setting work of relating models of parts and tools and/or human beings in accordance with an assembly line for each design subject must be performed in the designing stage by a designer.

Accordingly, also the technique disclosed in Japanese Patent Laid-Open No. 185431/1996 has a subject to be solved in that an unnecessary working time is assigned to a designer.

Further, in the technique disclosed in Japanese Patent Laid-Open No. 147166/1997, although, for example, where the positions of holes formed in two parts which form a design subject are same, the holes are detected as holes to be used for performing assembling operations of the two parts based on data outputted from a three-dimensional CAD system, depending upon a design subject, the two holes may not necessarily be holes to be used for performing assembling working of the two parts. Thus, the technique disclosed in Japanese Patent Laid-Open No. 147166/1997 has a subject to be solved in that it does not correctly reflect assembling and disassembling works of an actual apparatus.

Further, in the technique disclosed in Japanese Patent Laid-Open No. 147166/1997, since the relationship of assembling locations to tools and metal fittings to be used are determined uniquely and, when interference occurs upon assembly from the relationships, only the assembling order is taken into consideration, there is no room to select assembly parts or tools in accordance with working environment, and even a design subject which allows assembly depending upon selection of assembly parts or tools is sometimes determined that it does not allow assembly.

SUMMARY OF THE INVENTION

It is an object of the present invention to provide a simulation apparatus, a simulation method and a computer-readable recording medium having a simulation program recorded thereon as well as a designing supporting apparatus by which a problem upon designing can be found in the designing stage on the upstream and the workability can be verified without imposing an unnecessary working time to a designer.

In order to attain the aspect of the present invention, there is provided a simulation apparatus for simulating, based on design information of a design model designed in a virtual three-dimensional space while one or more standard part models standardized in advance based on a specification model are arranged in the design model, working for the standard part models arranged in the design model, comprising a working means model information storage section for storing information regarding a working means model related to one or more standard part models for working the standard part models, a working means model information extraction section for referring, based on information regarding the standard part models arranged in a design model, to the working means model information storage section to extract information regarding a working means model to be used to work the standard part models arranged in the design model, and a working simulation execution section for executing a simulation of the working for the standard part models with the working means model based on design information of the design model and the information regarding the working means model extracted by the working means model information extraction section.

The simulation apparatus may be constructed such that the working means model information storage section stores information of one ore more tool models, which may be, for example, models of actual tools and/or a hand model which is a model of a hand of a worker as the information regarding the working means model.

Pre-existing coefficients or constants (referred to as "workability evaluation coefficients"), may be used, along with simulation output, to evaluate the workability of the working means model.

According to another aspect of the present invention, there is provided a simulation method for simulating, based on data regarding a design model displayed in a virtual three-dimensional space and designed while one or more standard part models standardized in advance based on a specification model are arranged in the design model, workability according to a working means model used to work the standard part models arranged in the design model, comprising the steps of relating a working means model to one or more standard part models, acquiring the working means model related to the standard part models used upon designing of a design model, executing a simulation of working to be performed for the standard part models using the acquired working means model, and displaying a process of the execution of the simulation in a virtual three-dimensional space.

According to a further aspect of the present invention, there is provided a computer-readable recording medium having a simulation program recorded thereon for causing, in order to cause a computer to execute, based on design information of a design model designed in a virtual three-dimensional space while one or more standardized standard part models are arranged in the design model, a simulation of working with a working means model used to work the standard part models arranged in the design model, the computer to implement a function of acquiring information regarding a working means model related to the standard part models used upon designing of a design model, a function of executing a simulation of working to be performed for the standard part models based on the acquired information of the working means model, and a function of displaying a process of the execution of the simulation in a virtual three-dimensional space.

According to a still further aspect of the present invention, there is provided a designing supporting apparatus, comprising a standard part model information storage section for storing information regarding one or more standard part models standardized in advance based on a predetermined specification model, and a designing supporting section for arranging one or more standard part models to perform supporting for designing a subject in a virtual three-dimensional space, the designing supporting means including an attribute information extraction section for referring to the standard part model information storage section to extract attribute information of a working means model to be used to work the standard part models arranged in the subject designed in the virtual three-dimensional space, and a design data outputting section for outputting data regarding the subject designed in the virtual three-dimensional space and data regarding the attribute information extracted by the attribute information extraction section as design data.

With the simulation apparatus, the simulation method and the computer-readable recording medium having a simulation program recorded thereon as well as the designing supporting apparatus, information of working means models stored in the working means model storage section is related to standard part models by coordination of attribute information, and a working means model related to a standard part model used upon designing of a design model is acquired rapidly, and then a simulation of working to be performed for the standard part model can be executed using the acquired working means model. Consequently, during designing of an apparatus/equipment model in which a three-dimensional CAD system is used, there is no need of registering information regarding an actual tool into design data themselves in advance. Consequently, there is an advantage that the efficiency of modeling operation by a three-dimensional CAD system can be improved.

Further, even if, during designing of an apparatus/equipment model in which a three-dimensional CAD system is used, design data are produced without performing such working as retrieval or relating operation of part models, since a simulation of working for standard part models arranged in the design data can be executed, a simulation can be performed also at an initial stage or in the designing stage. Consequently, there is an advantage that a simulation can be performed in the further upstream designing stage and checking for interference of an apparatus or equipment after completion of designing can be prevented.

Since the workability can be verified without imposing an unnecessary designing time upon a designer through reduction of the frequency of doing over again of a part shape changing work or an assembling work of a three-dimensional CAD model, which provides a high working load, such as, for example, modification to a metal mold or variation of a shape of an actual part necessitated from a design change, the working efficiency can be raised remarkably.

The above and other objects, features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIG. 14 is a schematic view illustrating an example of an ideal working range amount of a working means model used in the simulation apparatus of FIG. 2;

FIG. 15 is a schematic view illustrating an example of a working range amount within which working can be performed using a working means model in the simulation apparatus of FIG. 2;

FIG. 35 is a block diagram showing a hardware construction of the computer shown in FIG. 34.

DESCRIPTION OF THE PREFERRED EMBODIMENTS a. Aspect of the Invention

First, an aspect of the present invention is described with reference to the drawings.

Figure 1:
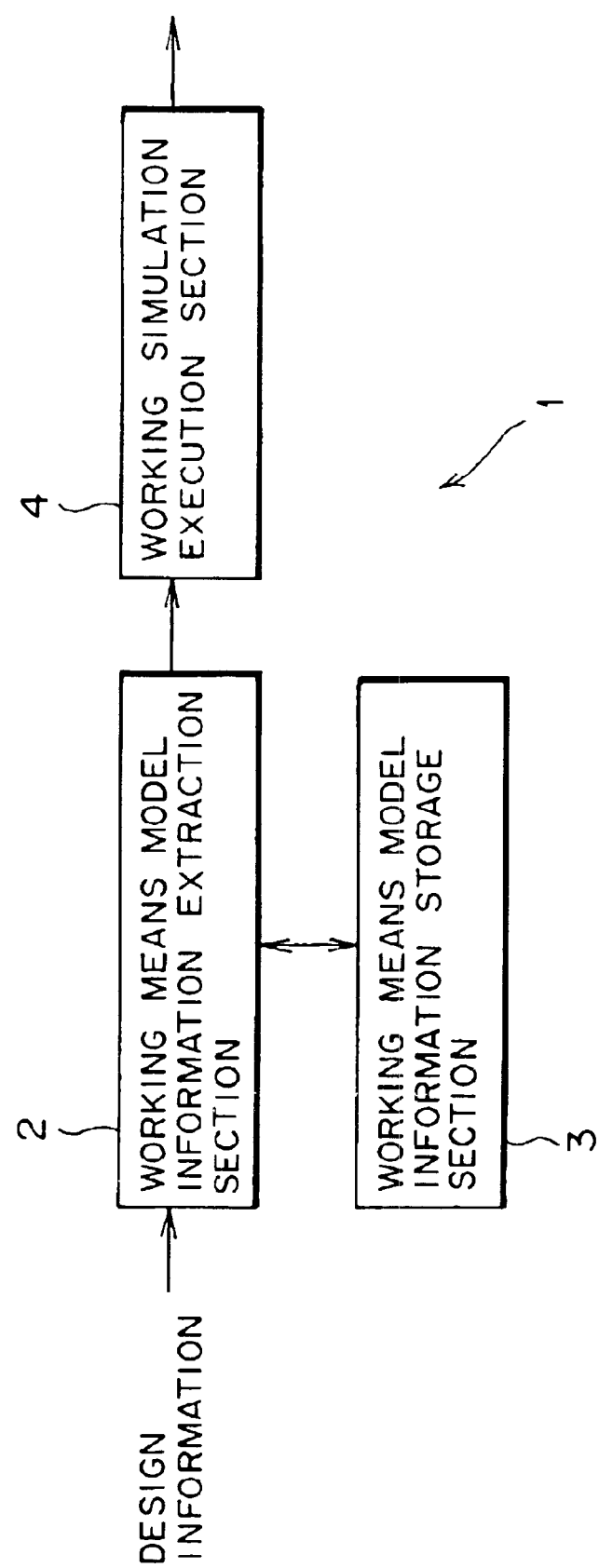
FIG. 1 is a block diagram illustrating an aspect of the present invention.

FIG. 1 is a block diagram of a simulation apparatus according to an aspect of the present invention. Referring to FIG. 1, the simulation apparatus is generally denoted at 1 and simulates, based on design information of a design model designed in a virtual three-dimensional space while one or more standard part models standardized in advance based on a specification model are arranged in the design model, working for the standard part models arranged in the design model. The simulation apparatus 1 includes a working means model information storage section 3, a working means model information extraction section 2 and a working simulation execution section 4.

The working means model information storage section 3 stores information regarding a working means model related to one or more standard part models for working the standard part models.

The working means model information extraction section 2 refers, based on information regarding the standard part models arranged in a design model, to the working means model information storage section 3 to extract information regarding a working means model to be used to work the standard part models arranged in the design model.

The working simulation execution section 4 executes a simulation of the working for the standard part models with the working means model based on design information of the design model and the information regarding the working means model extracted by the working means model information extraction section 2.

The simulation apparatus 1 may be constructed such that the information regarding the standard part models arranged in the design model include attribute information of the working means model related to the standard part models, and the working means model information extraction section 2 refers to the working means model information storage section 3 based on the attribute information to extract the information regarding the working means model.

The simulation apparatus 1 may be constructed such that the working means model information storage section 3 stores information of one or more tool models which are models of actual tools and/or a hand model which is a model of a hand of a worker as the information regarding the working means model.

The simulation apparatus 1 may otherwise be constructed such that the information regarding the working means model stored in the working means model information storage section 3 includes reference position information of the working means model when the working means model works the standard part models while the design information of the design model includes reference position information of the standard part models when the working means model works the standard part models, and the working simulation execution section 4 performs a simulation of a relationship in position/posture of the working means model to the standard part models based on the reference position information of the working means model and the standard part model.

In this instance, the simulation apparatus 1 may be constructed such that the working means model information storage section 3 stores information of a plurality of reference positions for any working means model which allows operation thereof in a plurality of different methods, and the working simulation execution section 4 executes a working simulation according to the plurality of operation methods.

The simulation apparatus 1 described above may further comprise an interference checking section for checking interference of the working means model while the working simulation execution section 4 executes a simulation of the working for the standard part models with the working means model.

In this instance, the simulation apparatus 1 may be constructed such that the interference checking section checks interference of the working means model including a route along which the working means model arrives at one of the standard part models when the standard part model arranged in the design model is worked using the working means model.

Further, the simulation apparatus 1 may further comprise a workability evaluation coefficient storage section for storing, for the working means model included in the same attribute, a workability evaluation coefficient which is used as a reference for evaluating a workability of the working means model, and a workability evaluation section for evaluating the workability based on a result of execution of the working simulation by the working simulation execution section 4 and also based on the workability evaluation coefficient stored in the workability evaluation coefficient storage section.

In this instance, the simulation apparatus 1 may be constructed such that the working means model information storage section 3 stores information of a plurality of reference positions for any working means model which allows operation thereof in a plurality of different methods and the working simulation execution section 4 executes a working simulation according to the plurality of operation methods while the workability evaluation coefficient storage section stores a workability evaluation coefficient which is used as a reference for evaluating a workability for each of the operation methods of the working means model, and the workability evaluation section evaluates the workability of the working means model for each of the working methods based on a result of execution of the working simulation according to the working method and is also based on the workability evaluation coefficient stored for the operation method of the working means model in the workability evaluation coefficient storage section.

Further, the simulation apparatus 1 may be constructed such that the working means model information storage section 3 stores information regarding a working condition necessary for working for the working means model as information regarding the working means model, and the working simulation execution section 4 executes a working simulation based on the information regarding the working condition of the corresponding working means model stored in the working means model information storage section 3.

In this instance, the working means model information storage section 3 may store information regarding working spaces necessary for working with the working means model as the information regarding the working conditions of the individual working means model.

Furthermore, at least one of a fastening part model, an adjustment part model and a connector part model may be used for the standard part models.

Meanwhile, according to the present invention, a simulation method for simulating, based on data regarding a design model displayed in a virtual three-dimensional space and designed while one or more standard part models standardized in advance based on a specification model are arranged in the design model, workability according to a working means model used to work the standard part models arranged in the design model, comprises the steps of relating a working means model to one or more standard part models, acquiring the working means model related to the standard part models used upon designing of a design model, executing a simulation of working to be performed for the standard part models using the acquired working means model, and displaying a process of the execution of the simulation in a virtual three-dimensional space.

In this instance, as the simulation of the working to be performed for the standard part models, a simulation of at least one kind of working from among assembling working, disassembling working, adjustment working and maintenance working for the standard part models may be performed.

Further, where a tool is used to work the standard part models, the tool and a hand of a worker who uses the tool may be used as the working means model to perform the simulation of the working. Meanwhile, where the standard part models are to be worked by a hand of a worker itself, the hand of the worker may be used as the working means model to perform the simulation of the working.

In those instance, when the process of execution of the simulation of the working is displayed in the virtual three-dimensional space, the working means model may be displayed in a shape suitable for an object of use in the virtual three-dimensional space.

Further, a process through which the working means model arrives at one of the standard part models which provides a subject position and a manner of working performed based on a condition defined in advance for the working means model may be displayed as the process of execution of the simulation of the working.

In this instance, after the working performed based on the condition defined in advance for the working means model is completed, a process through which the working means model is spaced away from the subject position based on a condition defined in advance for the standard part models may be displayed, and after the working means model is spaced by a predefined distance away from the subject position, the display of the working means model or the working means model and the standard part models may be erased.

Further, when interference occurs with the working means model in a process of execution of the working to be performed for the standard part models with the working means model, an occurrence condition of the interference may be displayed.

On the other hand, according to the present invention, a computer-readable recording medium having a simulation program recorded thereon is constructed such that the simulation program causes, in order to cause a computer to execute, based on design information of a design model designed in a virtual three-dimensional space while one or more standardized standard part models are arranged in the design model, a simulation of working with a working means model used to work the standard part models arranged in the design model, the computer to implement a function of acquiring information regarding a working means model related to one or more standard part models used upon designing of a design model, a function of executing a simulation of working to be performed for the standard part models based on the acquired information of the working means model, and a function of displaying a process of the execution of the simulation in a virtual three-dimensional space.

Further, according to the present invention, a designing supporting apparatus comprises a standard part model information storage section for storing information regarding one or more standard part models standardized in advance based on a predetermined specification model, and a designing supporting section for arranging one or more standard part models to perform supporting for designing a subject in a virtual three-dimensional space, the designing supporting means including an attribute information extraction section for referring to the standard part model information storage section to extract attribute information of a working means model to be used to work the standard part models arranged in the subject designed in the virtual three-dimensional space, and a design data outputting section for outputting data regarding the subject designed in the virtual three-dimensional space and data regarding the attribute information extracted by the attribute information extraction section as design data.

With the simulation apparatus, the simulation method and the computer-readable recording medium having a simulation program recorded thereon as well as the designing supporting apparatus, information of working means models stored in the working means model storage section is related to standard part models by coordination of attribute information, and a working means model related to a standard part model used upon designing of a design model is acquired rapidly, and then a simulation of working to be performed for the standard part model can be executed using the acquired working means model. Consequently, during designing of an apparatus/equipment model in which a three-dimensional CAD system is used, there is no need of registering information regarding an actual tool into design data themselves in advance. Consequently, there is an advantage that the efficiency of modeling operation by a three-dimensional CAD system can be improved.

Further, even if, during designing of an apparatus/equipment model in which a three-dimensional CAD system is used, design data are produced without performing such working as retrieval or relating operation of part models, since a simulation of working for standard part models arranged in the design data can be executed, a simulation can be performed also at an initial stage or in a designing stage. Consequently, there is an advantage that a simulation can be performed in the further upstream designing stage and leakage of interference checking of an apparatus or equipment after completion of designing can be prevented.

Since the workability can be verified without imposing an unnecessary designing time upon a designer through reduction of the frequency of doing over again of a part shape changing work or an assembling work of a three-dimensional CAD model, which provides a high working load, such as, for example, modification to a metal mold or variation of a shape of an actual part necessitated from a design change, the working efficiency can be raised remarkably.

Furthermore, with the simulation apparatus according to the aspect of the present invention described above, since attribute information of a working means model to be used to work can be included in information regarding a standard part model, even where the actual working means model is different because of a difference, for example, of an assembly line or a factory, there is no need of varying simulation conditions other than design data and the working means model, and the man-hours necessary for simulation working are reduced significantly. This provides another advantage that, since it is not necessary for the system to always store information regarding a large number of working means models, a simulation can be performed with a smaller amount of computer resources.

Further, with the simulation apparatus according to the aspect of the present invention described above, since information regarding the working means models stored in the working means model information storage section includes reference position information of the working means model side when the working means model works the standard part model and design information of the design model includes reference position information of the standard part model side when the working means model works the standard part model, it can be stored what tool is used in what positional relationship to the standard part model, and there is no need of getting aware of a type of a tool model to be used upon execution of a simulation or a positional relationship of the tool model to the standard part model and an efficient simulation operation can be performed simply. This also contributes to improvement in quality of a design subject.

Further, although the actual workability is different whether a standard tool is used or a special tool is used or where the same tool is used in a different manner, the workability can be evaluated while taking such a difference in workability into consideration. Consequently, there is an advantage that evaluation of the workability can be made further conform to real working.

b. Embodiment of the Invention

Figure 2:
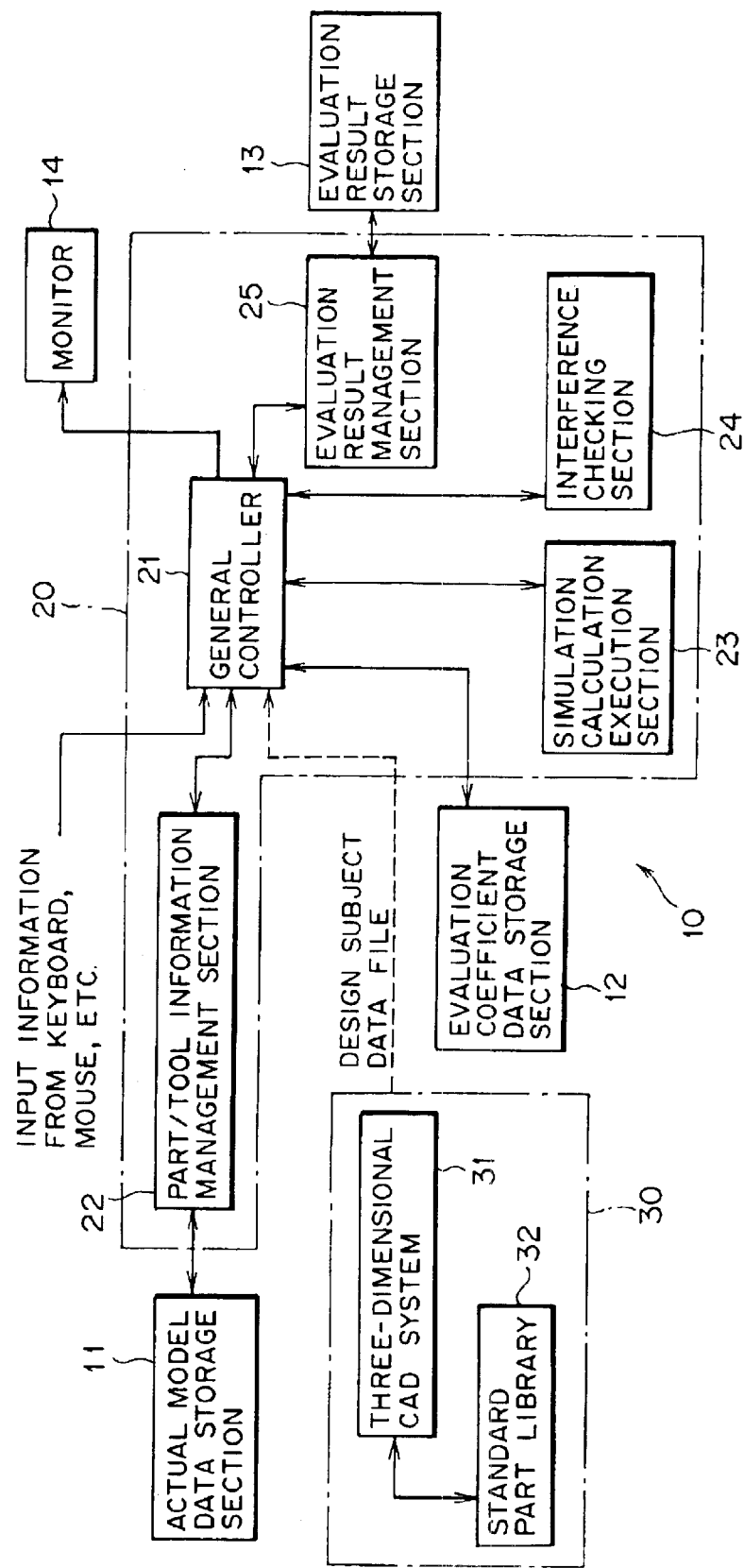
FIG. 2 is a functional block diagram of a simulation apparatus according to an embodiment of the present invention.

Referring now to FIG. 2, there is shown a simulation apparatus according to a preferred embodiment of the present invention. The simulation apparatus is generally denoted at 10 and is generally constructed such that it receives information (design information) regarding a design model (principally a structure model being designed) designed in a virtual three-dimensional space while part models are arranged by an external computer 30 as input file data and simulates working with working means models (for example, screwdrivers) which work standard part models (for example, screws) which form the design model.

In particular, the simulation apparatus 10 according to the present embodiment performs simulation regarding such working as assembling working, disassembling working, adjustment working or maintenance working regarding a standard part model. In other words, through operation of the simulation apparatus 10, working for a standard part model by a working means model can be regenerated in an equivalent condition to that of actual working.

Here, the standard part model is a part model standardized in advance based on a predetermined standard model and includes, for example, a fastening part model (for example, a fastening screw and so forth) for use to secure part models to each other, an adjustment part model for use to finely adjust an arrangement relationship between part models and so forth, a connector part model (for example, a modular jack for a telephone cable and so forth) for use for connection of a part model such as, for example, a cable to an external terminal, and so forth.

Meanwhile, the working means model includes an actual tool model (screwdriver, spanner and so forth) for use to work such a standard part model as described above, a hand model to be used when a worker works directly with his or her hand, and so forth.

The computer 30 includes a three-dimensional CAD system 31 which functions as a designing supporting section, and a standard part library 32 which functions as a standard part model information storage section, and outputs design data regarding a design model designed in a virtual three-dimensional space to the simulation apparatus 10.

The three-dimensional CAD system 31 performs supporting for designing a subject in a virtual three-dimensional space while arranging standard part models which will be hereinafter described. In other words, the three-dimensional CAD system 31 refers to the standard part library 32, which will be hereinafter described, based on operation information of an inputting device such as a keyboard or a mouse not shown which forms the external computer 30, and provides environment in which an arbitrary apparatus/equipment model can be designed in a virtual three-dimensional space.

In particular, in designing in which the three-dimensional CAD system 31 is used, in order to design an apparatus/equipment of a subject, modeling of various parts and arranging working of modeled parts (hereinafter referred to simply as part models) are performed or working of selectively and successively arranging appropriate ones of the standard part models stored in the standard part library 32 is performed.

Figure 4:
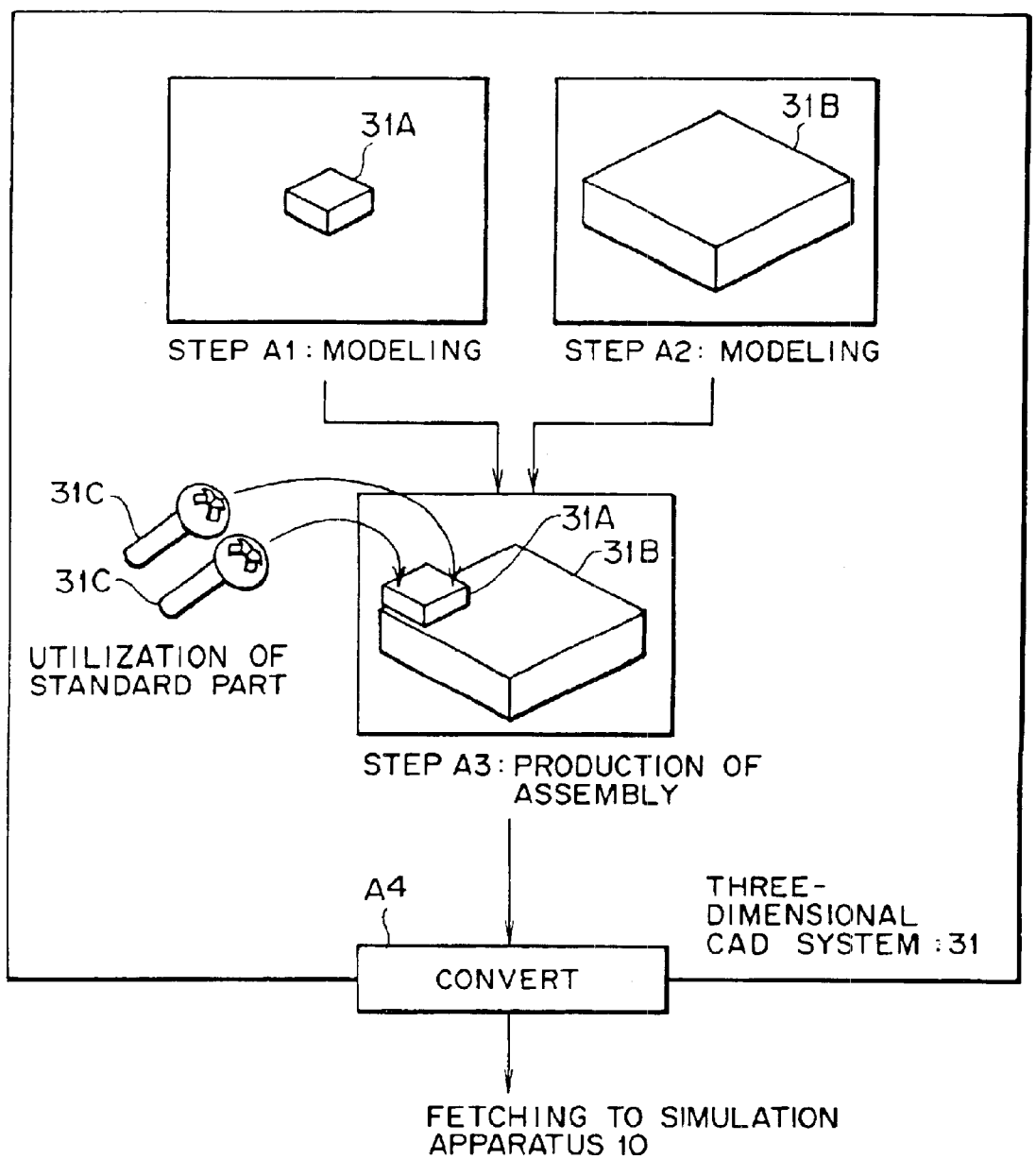
FIG. 4 is a diagrammatic view illustrating designing working by a three-dimensional CAD system shown in FIG. 2.

For example, as seen in FIG. 4, under environment wherein the three-dimensional CAD system 31 operates on the computer 30, the three-dimensional CAD system 31 can perform designing working by first producing (modeling) part models 31A and 31B based on operation information of the inputting device such as the mouse (steps A1 and A2) and then producing an assembly through a process of arranging standardized standard part models 31C so that they are assembled in a predetermined determined positional relationship to the part models 31A and 31B (step A3).

It is to be noted that design information (that is, three-dimensional CAD data) of the design model being designed by the computer 30 described above is suitably converted into file data (a design subject data file) (step A4) and fetched by the simulation apparatus 10 of the present embodiment.

More particularly, the simulation apparatus 10 can fetch such file data in the form of a file stored on a recording medium or can fetch file data inputted over a communication line or the like.

The standard part library 32 stores (defines) model data (three-dimensional CAD data such as the size and the shape) of part models which are used commonly in designing working by the three-dimensional CAD system 31 described above as model data of standard part models standardized in advance based on predetermined specification models.

For example, the standard part library 32 can store model data at least one of fastening part models such as screws, adjustment part models such as screws for adjusting arrangement relationships between part models which form apparatus/equipment models and connectors for connection between a housing and a cable as standard part models.

Further, the standard part library 32 stores, in addition to model data of standard part models described above, attribute information (virtual tool information) of working means models related to individual standard part models, position information (reference position information) regarding a reference position (on the standard part model side) when a working means model works a standard part model.

Figure 5:
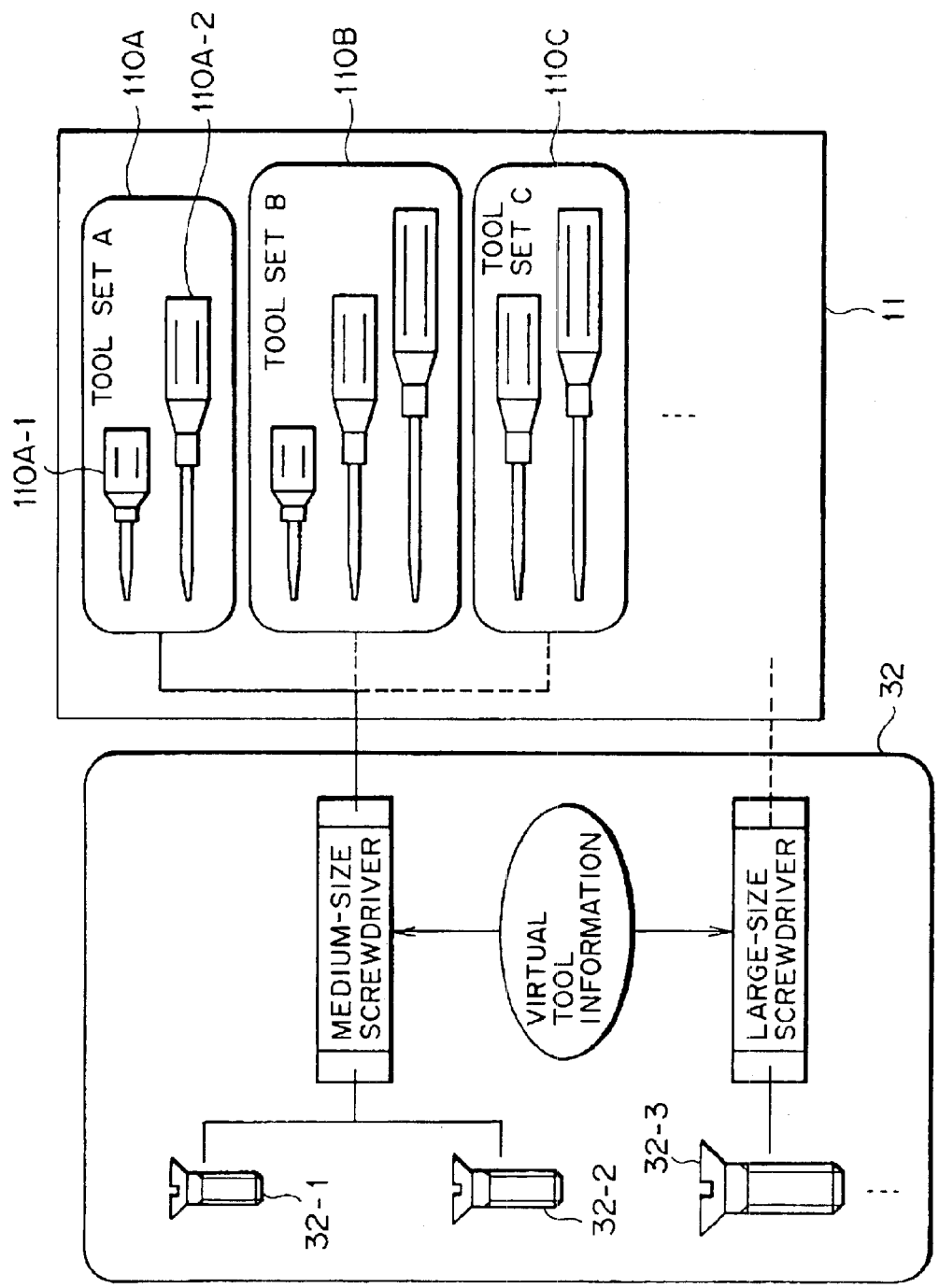
FIG. 5 is a diagrammatic view illustrating relating operation of standard part models stored in a standard part library and working means models stored in an actual model data storage section of the simulation apparatus of FIG. 2.

More particularly, as seen in FIG. 5, the standard part library 32 stores, for example, model data of fastening part models 32-1 to 32-3 as standard part models, and further stores attribute information of tool models for working the fastening part models 32-1 to 32-3 and information of reference positions upon working with the tool models.

In this instance, as attribute information of tool models to be used to work the fastening part models 32-1 and 32-2, a "medium-size screwdriver" is stored, and as attribute information of a tool model to be used to work the fastening part model 32-3 which is larger in size than the fastening part models 32-1 and 32-2, a "large-size screwdriver" is stored.

It is to be noted that, for attribute information of tool models, virtual tool names (virtual tool information) corresponding to categories of a plurality of types of actually used tool models categorized taking notice of a nature such as the size or the function like the "medium-size screwdriver" and "large-size screwdriver" mentioned above may be used.

Figure 6:
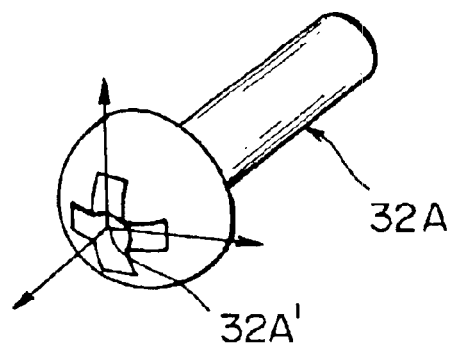
FIGS. 6 to 8 are schematic views each showing an example of a standard part model used in the simulation apparatus of FIG. 2 together with a reference position of it.

Further, as seen in FIG. 6, the aforementioned reference position of a model 32A of a screw as a standard part model which is fastened by a Phillips screwdriver is a position 32A', and the standard part library 32 can store information of the reference position 32A' (reference position information) together with model data and the aforementioned attribute information of the model 32A of a screw.

Figure 7:
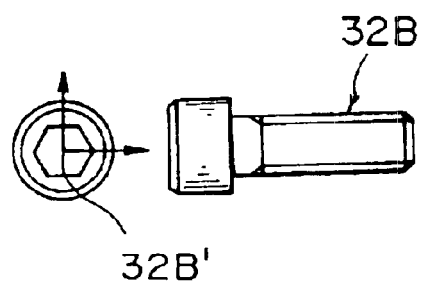

Similarly, as seen in FIG. 7, the reference position of a model 32B of a screw as a standard part model which is fastened by a hexagon wrench is a position 32B' which makes a reference when the model of a hexagon wrench works the model 32B, and the standard part library 32 can store information of the reference position 32B' (reference position information) together with model data and the aforementioned attribute information of the model 32B of a screw.

The computer 30 can refer, by operation of the three-dimensional CAD system 31, to the standard part library 32, in which information regarding such standard part models as described above is stored, to produce a design model. Information regarding standard part models which form the design data produced in this manner can include the attribute information and the reference position information (stored in such a standard part library 32 as described above).

In other words, the three-dimensional CAD system 31 described above functions as an attribute information extraction section for referring to the standard part library 32 to extract attribute information of a working means model for working a standard part model arranged in a design model as a subject designed in a virtual three-dimensional space, and further has a function as a design data outputting section for outputting data regarding the subject designed in the virtual three-dimensional space and data regarding the attribute information extracted by the attribute information extraction section to the simulation apparatus 10.

In particular, design information to be delivered as file data to the simulation apparatus 10 may include data of standard part models arranged in the virtual three-dimensional space as well as attribute information of working means models related to the individual standard part models and position information (reference position information) which makes references (on the standard part model side) when the working means models work the standard part models.

Figure 3:
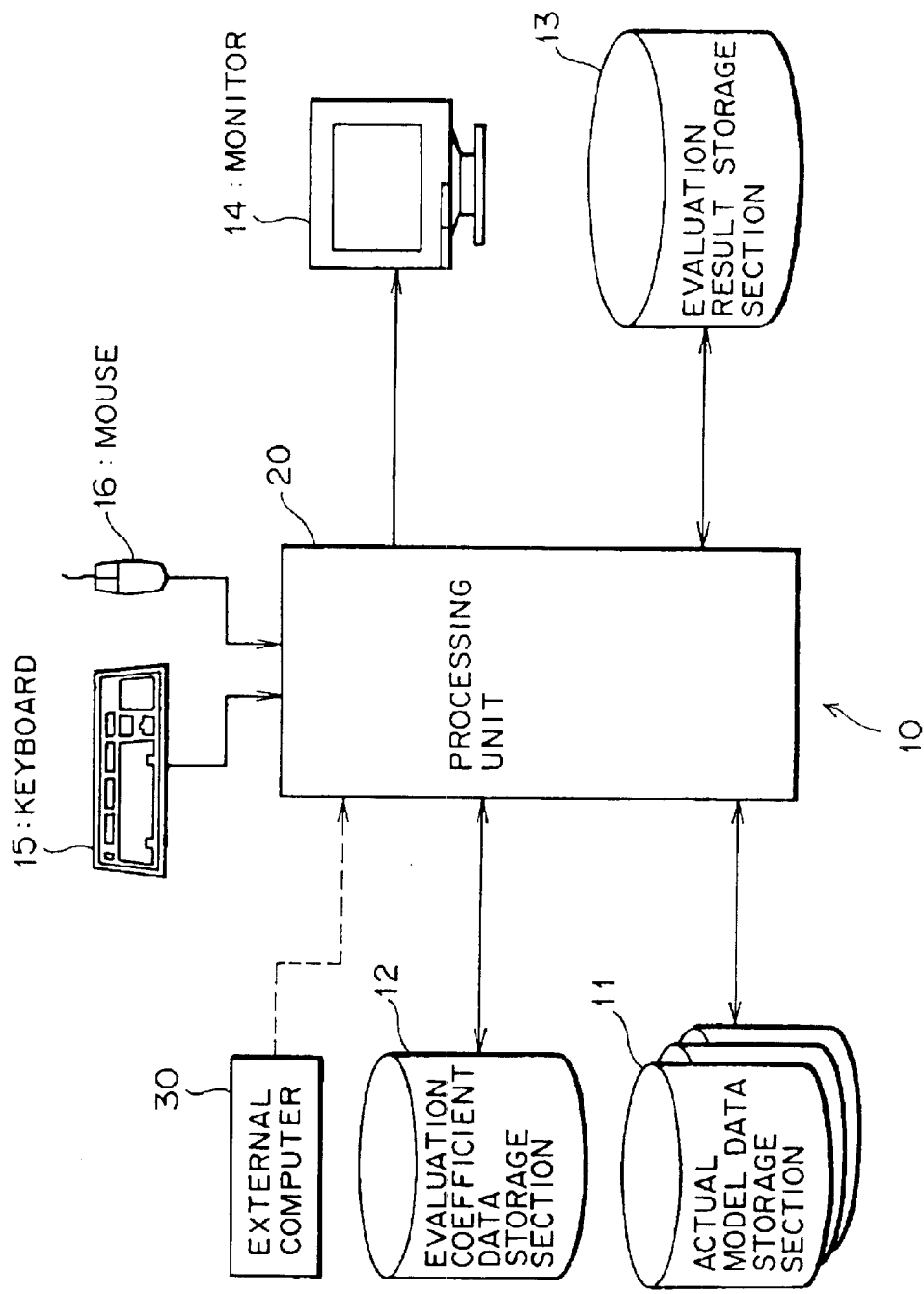
FIG. 3 is a diagrammatic view showing a hardware construction of the simulation apparatus of FIG. 2.

Referring now to FIG. 3, the simulation apparatus 10 according to the present embodiment is formed from a computer which includes, as hardware components, an actual model data storage section 11, an evaluation coefficient data storage section 12, an evaluation result data storage section 13, a monitor 14 which can display a manner of execution of a simulation, a keyboard 15 and a mouse 16 for performing an inputting operation, and a processing unit 20 which performs various processes to perform a working simulation according to the present embodiment.

The actual model data storage section 11 stores information regarding actual tool and/or hand models as working means models for working standard part models in a condition related to various standard part models stored in the standard part library 32 and thus functions as a working means model information storage section.

Further, the actual model data storage section 11 can store information regarding working means models as actual model data in a condition related to attribute information of the working means models. In particular, the processing unit 20 which will be hereinafter described can refer to the actual model data storage section 11 using attribute information as a key to extract information regarding a necessary working means model.

The attribute information of the working means models related to the working means models in the actual model data storage section 11 correspond to the attribute information of the working means models described above included as information regarding the standard part models so that the standard part models in the design data and the working means models stored in the actual model data storage section 11 can be related to each other through the attributed information.

In other words, the processing unit 20 which will be hereinafter described can refer to the actual model data storage section 11 using attribute information of a working means model included in the information regarding a standard part model in design data as a key to extract information regarding the working means model to be used to work the standard part model.

Further, the actual model data storage section 11 can store, as information regarding a working means model described above, position information (reference position information) which makes a reference (on the working means model side) when a standard part model is to be worked in addition to model data of the working means model.

Figure 8:
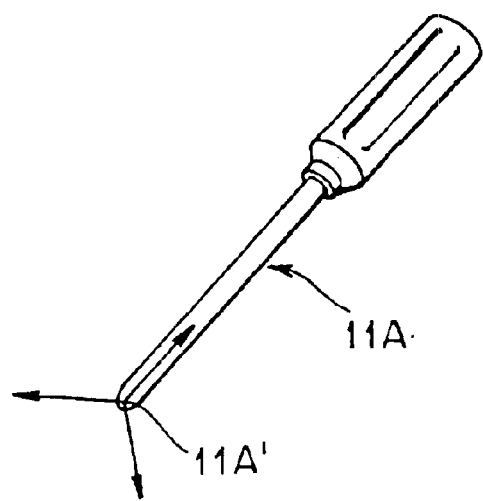

In particular, referring to FIG. 8, the reference position of an actual model 11A of a Phillips screwdriver corresponds to a position 11A' which makes a reference when the Phillips screwdriver as the actual model 11A performs working, and the actual model data storage section 11 can store also information of the reference position 11A' (reference position information) together with model data of the actual model 11A.

Further, the actual model data storage section 11 stores information regarding working conditions necessary for working of individual working means models, for example, information regarding working spaces necessary upon working with the working means models.

For example, while a working means model such as a spanner requires, from a characteristic of working to be performed thereby, a working space of a predetermined magnitude therearound when it performs working, and the actual model data storage section 11 stores, as such information regarding working means models, ideal conditions which are ideal working conditions upon working, standard conditions which allow ordinary working, necessary and minimum conditions which allow the working means models to function, basic rotation units and so forth.

By the way, depending upon a nature of a working means model, working can be performed in a plurality of working methods, and a plurality of reference positions when working is performed may possibly be available corresponding to the working methods.

Figure 9A:
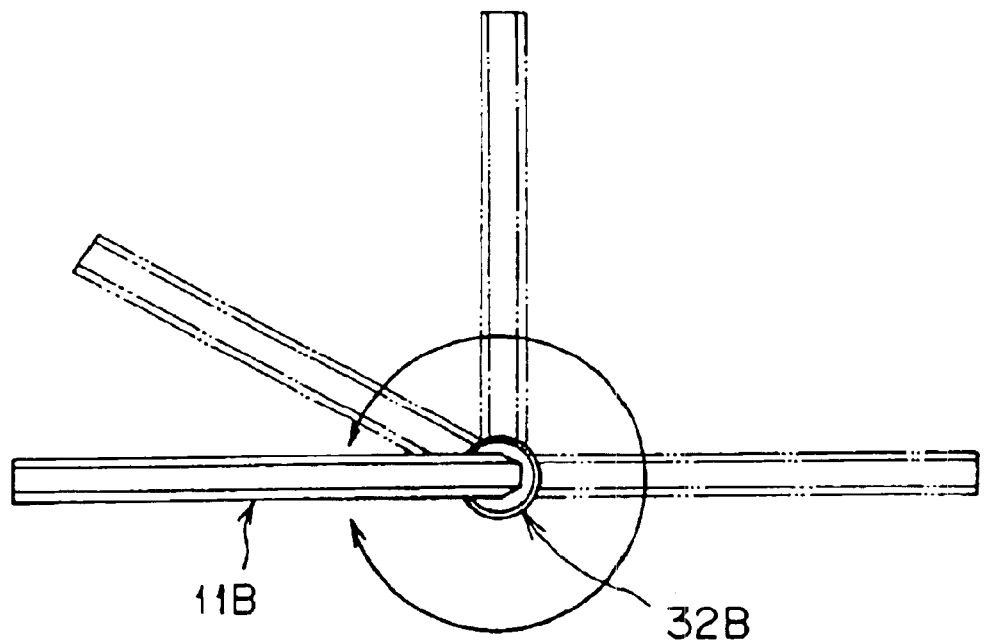
FIGS. 9A, 9B and 10A, 10B are schematic views showing different examples of a standard part model and a working means model used in the simulation apparatus of FIG. 2 together with reference positions of them.
Figure 9B:
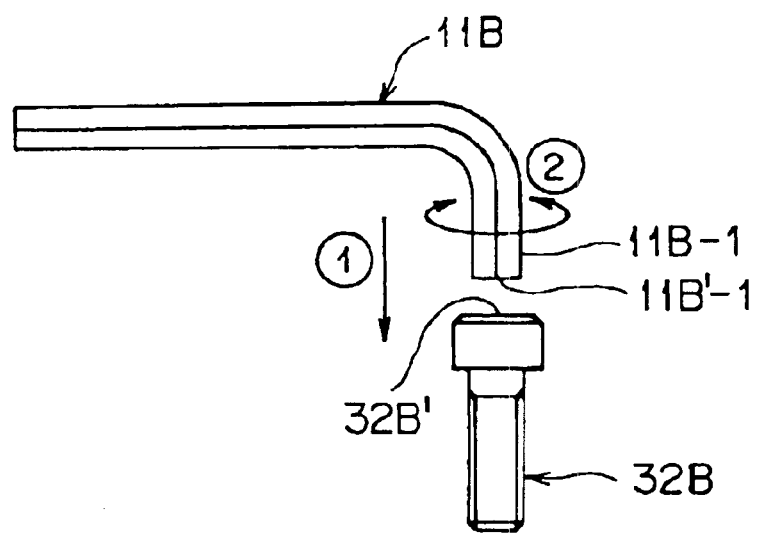
Figure 10A:
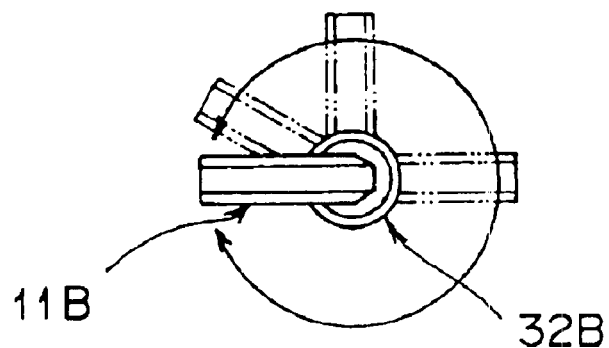
Figure 10B:
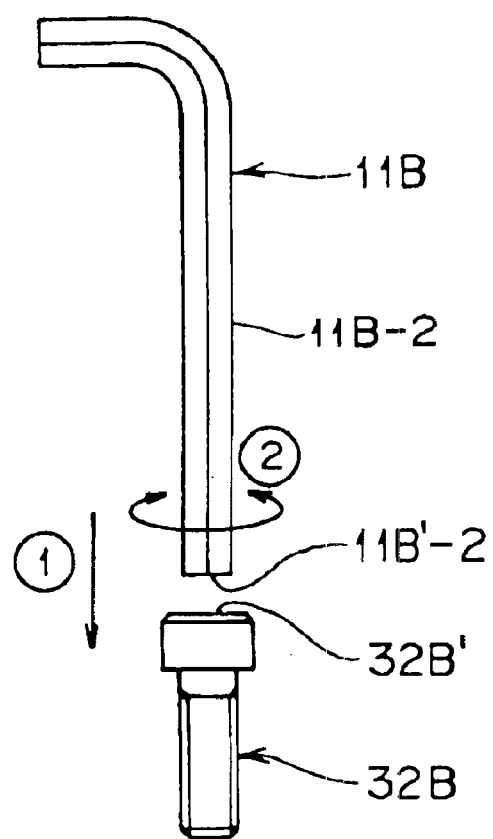

For example, an actual model 11B of a hexagon wrench can be applied to either of a working method wherein a shorter one 11B-1 of two long and short shanks 11B-2 and shank 11B-1 thereof is fitted (refer to ① of FIG. 9B) in a recess 32B' which makes a reference position to the standard part model 32B to perform working (refer to FIG. 9A or ② of FIG. 9B) and another working method wherein the longer shank 11B-2 thereof is fitted (refer to ① of FIG. 10B) in the recess 32B' which makes a reference position to the standard part model 32B to perform working (refer to FIG. 10A or ② of FIG. 10B).

In this instance, the actual model data storage section 11 can store information regarding a reference position 11B'-1 when working is performed in such a manner as illustrated in FIGS. 9A and 9B using the actual model 11B of a hexagon wrench, and can store information regarding another reference position 11B'-2 when working is performed in such a manner as illustrated in FIGS. 10A and 10B.

In other words, the actual model data storage section 11 can store, for a working means model which can be operated in a plurality of methods as described above, information of the plurality of reference positions.

The evaluation coefficient data storage section 12 stores, for each of working means models included in the same attribute, a workability evaluation coefficient which makes a reference for evaluation of the workability of the individual working means model, and functions as a workability evaluation coefficient storage section.

In particular, the evaluation coefficient data storage section 12 stores a workability evaluation coefficient for evaluating the workability of each working means model with reference to the workability in ordinary working environment with a standard working means model based on attribute information related to each standard part model in the standard part library 32 described above.

Further, for a working means model which can be operated in a plurality of different methods as described above, the evaluation coefficient data storage section 12 stores a workability evaluation coefficient which makes a reference for evaluation of the workability for each of the operation methods of the working means model.

The evaluation result data storage section 13 stores a workability evaluation result calculated based on an evaluation result of the workability for a result of a working simulation performed with a working means model and a workability evaluation coefficient stored in the evaluation coefficient data storage section 12 described above.

It is to be noted that the actual model data storage section 11, evaluation coefficient data storage section 12 and evaluation result data storage section 13 described above can be implemented by a recording medium as an external storage apparatus such as a disk apparatus, a CD-ROM or a floppy disk, or a remote data base connected over a line or the like.

Referring back to FIG. 2, the processing unit 20 includes a processor, a memory and so forth not shown as hardware components, and includes, as functional components, a general controller 21, a part/tool information management section 22, a simulation calculation execution section 23, an interference checking section 24, and a evaluation result management section 25 and can perform various processes necessary to execute a working simulation according to the present embodiment.

It is to be noted that functions as the general controller 21, part/tool information management section 22, simulation calculation execution section 23, interference checking section 24 and evaluation result management section 25 of the processing unit 20 described above can be implemented by fetching a simulation program from a computer-readable recording medium such as, for example, a CD-ROM or a disk apparatus and causing the simulation program to operate on the processing unit 20.

The general controller 21 generally controls entire processing performed by the processing unit 20. Particularly, the general controller 21 accepts operation instruction information or the like from the keyboard 15 or the mouse 16, requests the other function sections 22 to 25 to perform necessary processing or accesses data of the function sections 22 to 25 based on design information from the computer 30 described above inputted thereto as file data, and controls the monitor 14 to display thereon results of various processes or a result of execution of an operation instruction from the keyboard 15 or the mouse 16.

The part/tool information management section 22 receives, through the general controller 21, attribute information of a working means model related to a standard part model arranged in a design model in a virtual three-dimensional space, which forms design information from the computer 30 described above, and refers to the actual model data storage section 11 to extract working means model data corresponding to the attribute.

More particularly, the part/tool information management section 22 refers to an address conversion table (not shown) or the like provided to establish relation between attribute information from the general controller 21 and address information of the actual model data storage section 11 in which corresponding working means model data are stored.

In this manner, for example, information regarding a working means model of a storage area for working means models (in this instance, for example, tool sets 110A to 110C and so forth) corresponding to the "medium-size screwdriver" as attribute information (virtual tool information) can be extracted (refer to FIG. 5).

Consequently, the part/tool information management section 22 can manage extracted information regarding a working means model (including model data and reference position information) and information regarding a standard part model from the general controller 21 (including model data and reference position information) in a related condition to each other based on attribute information, thereby achieving enhancement in efficiency of information management regarding standard parts and actual parts.

Accordingly, the general controller 21 and the part/tool information management section 22 described above function as a working means model information extraction section which refers to the actual model data storage section 11 based on information regarding a standard part model which forms design information of a design model to extract information regarding the working means model to be used to work the standard part model arranged in the design model.

In this instance, the information regarding a standard part model arranged in a design model can include attribute information of a working means model related to the standard part model, and the part/tool information management section 22 refers to the actual model data storage section 11 based on the attribute information to extract a working means model.

The simulation calculation execution section 23 performs various calculation processes for simulating working for a standard part model arranged in a design model designed in a virtual three-dimensional space. Accordingly, by calculation of the simulation calculation execution section 23, the position of a working means model is moved in a virtual three-dimensional space to regenerate operation when the working means model works a standard part model.

In particular, by calculation of the simulation calculation execution section 23 described above, three-dimensional CAD data as an execution process or an execution result of a working simulation in a virtual three-dimensional space can be produced, and by using the three-dimensional CAD data produced by the calculation of the simulation calculation execution section 23, the general controller 21 can control the monitor 14 to display a manner of the working simulation.

In other words, the general controller 21 and the simulation calculation execution section 23 function as a working simulation execution section which executes a simulation of working with a working means model for a standard part model described above based on design information of a design model inputted as file data and information regarding a working means model extracted by the part/tool information management section 22.

Further, the general controller 21 and the simulation calculation execution section 23 described above can execute a working simulation based on information regarding a working condition described above for each of the working means models stored in the actual model data storage section 11.

For example, when a working simulation with a working means model such as, for example, a spanner which requires, from a nature of working, a working space of a predetermined magnitude therearound when it performs working, the general controller 21 and the simulation calculation execution section 23 can extract an ideal condition, a standard condition, a necessary least condition, a basic rotation unit or the like for working with the working means model from the actual model data storage section 11 and execute a working simulation based on the conditions.

Further, the general controller 21 and the simulation calculation execution section 23 execute, for a working means model such as a hexagon wrench which can be operated in a plurality of methods, working simulations according to the plurality of operation methods in a priority order set in advance.

The interference checking section 24 checks, while the general controller 21 and the simulation calculation execution section 23 described above execute a simulation of working with a working means model for a standard part model, interference of the working means model with any other part model.

In other words, the interference checking section 24 checks, based on three-dimensional CAD data produced by the general controller 21 and the simulation calculation execution section 23 described above, in a process of working performed by the working means model for the standard part model, whether or not the working means model interferes with any other part model.

The evaluation result management section 25 performs calculation processing for evaluation of the workability based on a result of execution of a working simulation by the simulation calculation execution section 23 and a workability evaluation coefficient inputted through the general controller 21 and stored in the evaluation coefficient data storage section 12. A function as a workability evaluation section is implemented by the evaluation result management section 25 and the general controller 21.

In other words, the evaluation result management section 25 calculates data for evaluation of the workability with reference to standard working environment based on a result of execution of a working simulation of a working means model by the simulation calculation execution section 23 and a workability evaluation coefficient stored in the evaluation coefficient data storage section 12, and stores a result of the calculation into the evaluation result data storage section 13.

Further, the evaluation result management section 25 calculates, for a working means model for which working can be performed in a plurality of operation methods such as, for example, a hexagon wrench, data for evaluation of the workability for each of the operation methods of the working means model based on a result of execution a working simulation by the operation method and a workability evaluation coefficient stored for the operation method of the working means model in the evaluation coefficient data storage section 12.

In the processing unit 20 of the simulation apparatus 10 according to the embodiment of the present invention having the construction described above, data (design information) regarding a design model in a virtual three-dimensional space designed while a standard part model standardized in advance is arranged based on a predetermined specification model is inputted as file data from the computer 30, and a simulation of working for the standard part model is performed and a result of the simulation is displayed on the monitor 14.

In particular, the general controller 21 and the simulation calculation execution section 23 can confirm, through a simulation of working performed with a working means model for the standard part model arranged in the design model based on the file data, whether or not there is a route along which the working means model can reach the standard part model without any interference and whether or not a working range amount necessary for the working means model to perform working is assured.

It is to be noted that the actual model data storage section 11 of the simulation apparatus 10 stores attribute information regarding the working means model in a related condition to attribute information of the working means model to be used for the standard part model which forms the design model.

Consequently, information regarding the standard part model in the design information which forms the file data (that is, attribute information of the working means model to be used to work the standard part model) can be related to attribute information of the working means model stored in the actual model data storage section 11. Consequently, the working means model and the standard part model are related to each other.

By such relating condition between the standard part model and the working means model as described above, when the simulation apparatus 10 starts a working simulation for the standard part model used upon designing of the design model, it rapidly acquires information regarding the working means model for the standard part model which makes a subject and executes a simulation of working to be performed for the standard part model, and a process of execution of the simulation is displayed on the monitor 14.

Figure 11:
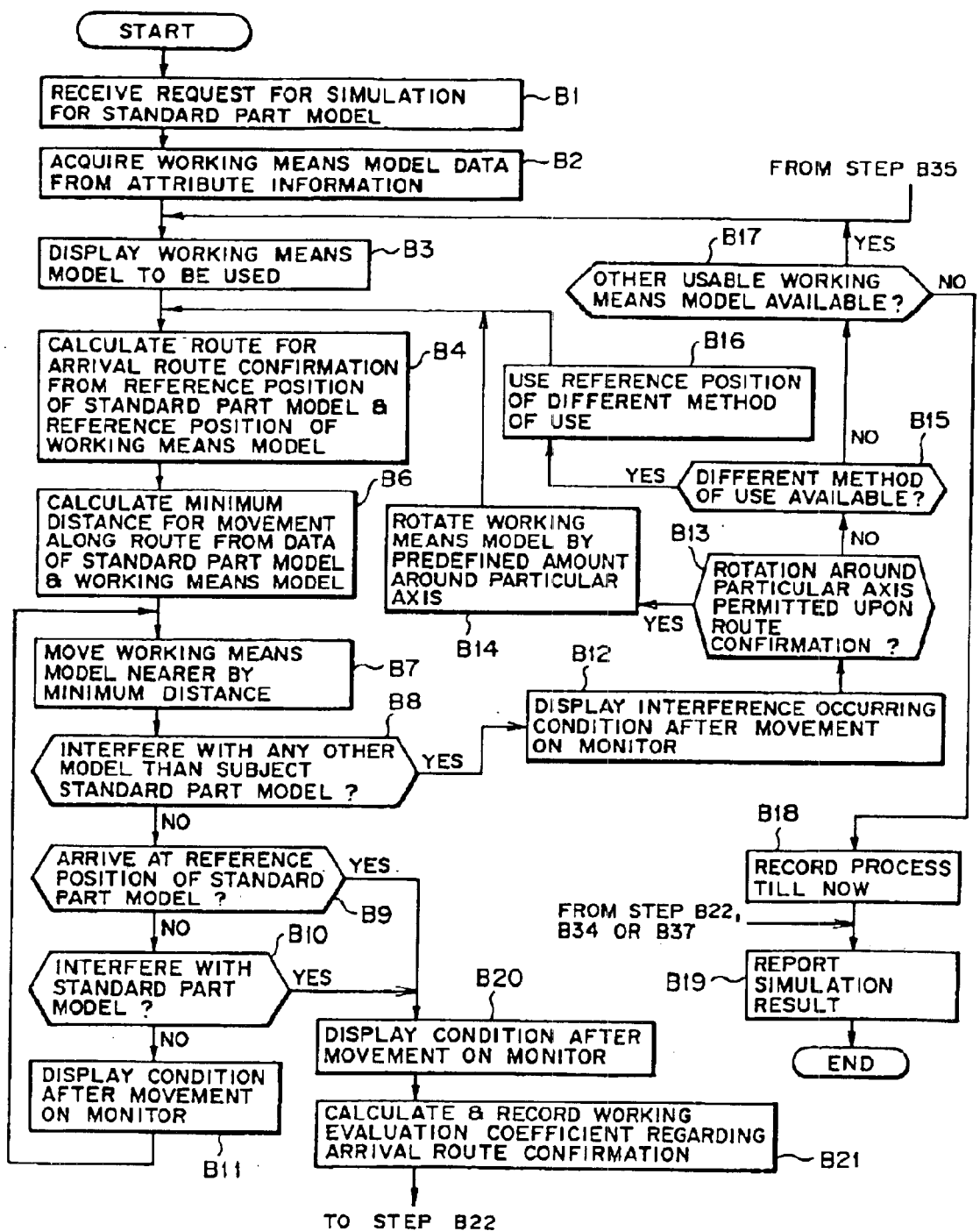
FIGS. 11 and 12 are flow charts illustrating an example of operation of the simulation apparatus of FIG. 2.

In particular, referring to FIG. 11, the processing unit 20 of the simulation apparatus 10 receives an instruction based on an operation of the keyboard 15 or the mouse 16 regarding design data of a subject by the three-dimensional CAD system 31 fetched from the computer 30 and executes a working simulation of the standard part model of the design model (step B1).

More particularly, the processing unit 20 of the simulation apparatus 10 designates a certain standard part model from among part models arranged in a design model in a virtual three-dimensional space by means of the keyboard 15 or the mouse 16 and refers, by the part/tool information management section 22 thereof, to the actual model data storage section 11 to rapidly extract a working means model to be used to work the thus designated standard part model, and then executes a working simulation.

Here, the general controller 21 extracts attribute information of the working means model to be used to work the standard part model designated in such a manner as described above from within the file data fetched from the computer 30, and the part/tool information management section 22 refers to the actual model data storage section 11 based on the extracted attribute information to acquire information regarding the working means model included in the attribute described above (step B2).

It is to be noted that, if the information regarding the working means model acquired by the part/tool information management section 22 represents that a plurality of working means models corresponding to the attribute described above are available, the general controller 21 instructs the simulation calculation execution section 23 to perform calculation processing for executing a working simulation of the working means models successively in the descending order of the priority degree based on a priority order set for the working means models.

For example, if the attribute information of the standard part model arranged in the design model is the "medium-size screwdriver" (refer to FIG. 5), then the general controller 21 refers to the actual model data storage section 11 using the attribute information as a key to fetch information regarding the tool set 110A.

In this instance, the standard part model arranged in the design model has information "medium-size screwdriver" as tool information (virtual tool information) to be used, and the part/tool information management section 22 acquires the tool set 110A as information regarding an actual tool model (actual model) based on the information "medium-size screwdriver" from the actual model data storage section 11.

On the other hand, the general controller 21 instructs the simulation calculation execution section 23 to start calculation processing for execution of a working simulation beginning with, from between two screwdrivers which forms the tool set 110A, that screwdriver which has a higher priority degree as a screwdriver to be used based on the priority order set in advance (for example, beginning with that one of the two screwdrivers which has a longer shank).

It is to be noted that the priority degree mentioned above can be set based on evaluation coefficients regarding the workability of individual working means models of the same attribute stored in the evaluation coefficient data storage section 12 such that a working means model having a higher workability has a higher priority degree set thereto.

Further, also when a plurality of methods of use are available for a single working means model, the general controller 21 instructs the simulation calculation execution section 23 to perform calculation processing for execution of a working simulation successively for the methods of use in the descending order of the priority degree based on the priority order set in advance for the individual methods of use of the working means model.

Also in this instance, the priority degrees mentioned above can be set based on workability evaluation coefficients set for the operation methods of the same working means model stored in the evaluation coefficient data storage section 12 such that a working means model having a higher workability has a higher priority degree set thereto.

Further, the general controller 21 receives the information regarding the working means model acquired by the part/tool information management section 22 and controls the monitor 14 so that the working means model for which a working simulation should be performed may be displayed together with the design model described above on the monitor 14 (step B3). Consequently, as three-dimensional CAD data to be processed in the simulation apparatus 10, the data of the working means model are handled simultaneously with the design data.

Meanwhile, when the simulation calculation execution section 23 receives the instruction to perform calculation processing for execution of a simulation from the general controller 21, it calculates a route for arrival route confirmation from the reference position information of the subject standard part model in the virtual three-dimensional space and the reference position information of the working means model (step B4).

It is to be noted that, as described above, the reference position information of the standard part model described above is included in the file data as the design data inputted from the computer 30 while the reference position information of the working means model is included in the information regarding the working means model fetched by the part/tool information management section 22 referring to the actual model data storage section 11, and the simulation calculation execution section 23 calculates a route for arrival route confirmation based on the two kinds of reference position information described above.

After the route for arrival route confirmation is calculated, the simulation calculation execution section 23 calculates a unit movement distance (minimum distance) to be used for movement of the working means model along the route from the model data of the standard part model and the working means model (step B6).

Then, by calculation of the simulation calculation execution section 23, position/posture data of the working means model after the working means model moves toward the standard part model along the route for arrival route confirmation by the unit movement distance calculated in such a manner as described above (step B7).

In other words, the general controller 21 and the simulation calculation execution section 23 perform a simulation of relationships in position and posture of the working means model to the standard part model based on the reference position information of the working means model and the reference position information of the standard part model.

The interference checking section 24 performs interference checking processing for the three-dimensional CAD data after the movement by the unit movement distance described above. In particular, the interference checking section 24 checks based on the three-dimensional CAD data produced by the calculation of the simulation calculation execution section 23 whether or not interference occurs between the working means model and some other part model or standard part model (steps B8 to B10).

In other words, the interference checking section 24 checks interference of the working means model including the route along which the working means model arrives at the standard part model when the standard part model arranged in the design part is to be worked using the working means model.

In particular, until the interference checking section 24 detects that interference of the working means model with any model other than the subject standard part model occurs or the working means model arrives at the reference position of the standard part model or else interference of the working means model with the standard part model occurs, the simulation calculation execution section 23 moves the position of the working means model described above toward the standard part model while it causes the monitor 14 to display thereon a condition of the movement of the working means model through the general controller 21 (through the NO routes of steps B8 to B10 to step B11).

In short, a simulation is executed including a route along which a working means model arrives at a standard part model arranged in an apparatus/equipment model when the working means model is used to work the standard part model, or in other words, an arrival route for adjusting the working means model to the working position of the standard part model.

Particularly, making use of the fact that information regarding the standard part model includes such reference position information as indicated by, for example, reference symbol 32A' shown in FIG. 6 and information regarding the working means model includes such reference position information as indicated by, for example, reference symbol 11A' in FIG. 8, the reference position of the working means model is moved toward the reference position of the standard model while interference checking is performed in accordance with the necessity.

Through the process that the process of the simulation is displayed on the monitor 14 under the control of the general controller 21 while calculation of the simulation calculation execution section 23 and interference checking of the interference checking section 24 are performed (step B11), confirmation of the arrival route along which the working means model when working is started arrives at the position of the standard part model is simulated while a manner in which the working means model moves step by step by the unit movement distance is displayed on the monitor 14.

In other words, in the process wherein the model 110A-1 of a screwdriver as the working means model arrives at the model 32-1 of a screw as the standard part model, if the model 110A-1 of a screwdriver interferes with another part model 33, the interference checking section 24 outputs a signal representing this, thereby allowing discrimination that there is a trouble in working as a result of occurrence of interference.

Figures 13A, 13B:
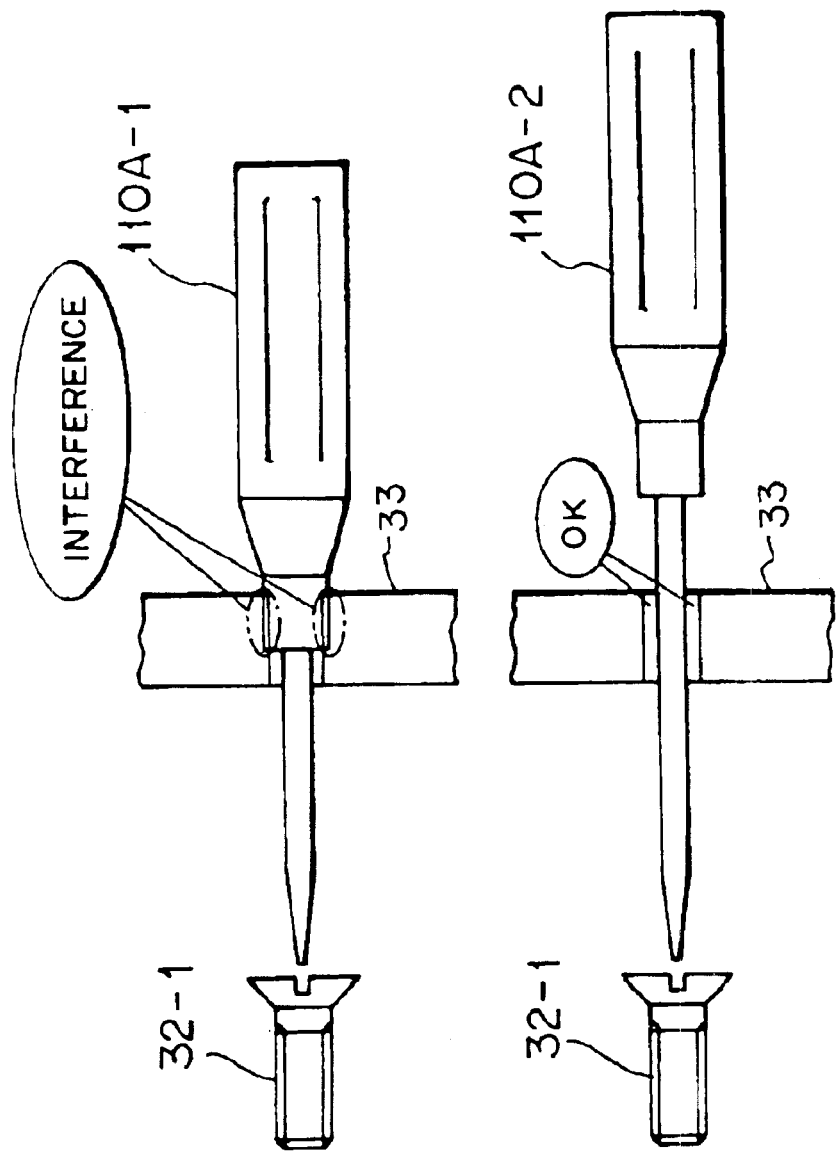
FIG. 13A is a schematic view illustrating an example wherein it is detected by the simulation apparatus of FIG. 2 as a result of confirmation of a route along which a working means model arrives at a standard part model that interference occurs between them and FIG. 13B is a similar view but illustrating another example wherein it is detected by the simulation apparatus of FIG. 2 as a result of confirmation of a route along which a working means model arrives at a standard part model that interference does not occur between them.

If a result of the working simulation proves that, for example, the model 110A-1 of a screwdriver arrives at the model 32-1 of a screw without any interference with the other part model 33 as seen in FIG. 13B, then occurrence of interference is not detected by the interference checking section 24. However, if interference of the model 110A-1 of a screwdriver occurs with the other part model 33 in the process wherein the model 110A-1 of a screw arrives at the model 32-1 of a screw as seen in FIG. 13A, then the interference checking section 24 detects this occurrence of interference.

It is to be noted that FIGS. 16 to 19 illustrate an example of a displaying manner on the monitor 14 upon confirmation of an arrival route of a model (working means model) 43 of a screwdriver to be used to work a model (standard part model) 42 of a screw arranged on a design model 41.

In particular, in FIGS. 16 to 19, there is illustrated an example wherein it is displayed on the monitor 14 that the model (working means model) 43 of a screwdriver moves step by step by the unit movement distance following the route for arrival route confirmation without interfering with any other part model (refer to FIG. 16 to FIG. 17 or FIG. 17 to FIG. 18) until it arrives at the position of the model 42.

Here, if a result of the interference checking performed by the interference checking section 24 while the working means model is moved toward the subject standard part model as described above proves that interference of the working means model with any other model than the standard part model occurs, then the interference condition which occurs after the movement of the working means model is displayed on the monitor 14 under the control of the general controller 21 (from the YES route of step B8 to step B12).

In other words, when interference of the working means model occurs in the process of execution of working to be performed for the standard part model by the working means model, the monitor 14 displays the interference occurrence condition.

In this instance, when the simulation calculation execution section 23 confirms the arrival route of the working means model, if rotation of the working means model around a particular axis is permitted (the YES route of step B13), then the simulation calculation execution section 23 produces three dimensional CAD data after rotation of the position of the working means model by a predefined amount around the particular axis by calculation (step B14) and then calculates the unit movement distance together with the route for arrival route confirmation newly (steps B4 and B6).

For example, where rotation around a particular axis is defined when the reference positions of a standard part model and a working means model are to be adjusted to each other like a spanner, even if the arrival route cannot be confirmed when such rotation is not performed, it is only required that the arrival route can be confirmed based on some other rotation condition.

Further, when the arrival route of the working means model is confirmed by the simulation calculation execution section 23, if rotation of the working means model around the particular axis is not permitted (the NO route of step B13), then if the working means model has some other method of use (the YES route of step B15), then the simulation calculation execution section 23 uses the reference position of the working means model according to the method of use (step B16) to calculate the unit time distance together with the route for arrival roue confirmation newly (steps B4 and B6).

After the unit movement distance is calculated together with the route for arrival route confirmation newly in such a manner as described above, the general controller 21 and the simulation calculation execution section 23 execute a simulation for arrival route confirmation again to move the working means model toward the standard part model on the monitor 14 while the interference checking section 24 performs interference checking as described above (the closed loop of step B7, the NO routes of steps B8 to B10 and step B11).

It is to be noted that, if it is discriminated in step B15 described above that the working means model has no other method of use, then the general controller 21 checks the attribute information of the standard part model described above to discriminate whether or not there is some other available working means model (step B17).

If there is some other available working means model, then the general controller 21 controls the monitor 14 to display the working means model and executes a simulation for arrival route confirmation including interference checking similar to that described hereinabove (from the YES route of step B17 to steps B4 to B11). However, if there is no other available working means model, then the general controller 21 records the process till then and reports it as a simulation result through a printing apparatus not shown or the monitor 14 (steps B18 and B19).

By the way, if it is discriminated in step B9 or step B10 described above that the working means model arrives at the position of the standard part model without suffering from interference with any other part model (when it is detected that the working means model arrives at the standard part model or it is detected that interference between the working means model and the standard part model 42 occurs), then the general controller 21 controls the monitor 14 to display the condition after the movement (step B20; refer to FIG. 19), and the evaluation result management section 25 calculates a workability evaluation result regarding the arrival route confirmation and records the workability evaluation result of the calculation into the evaluation result data storage section 13 (step B21).

When confirmation of the route along which the working means model moves from the remote position to the position of the standard part model is performed as described above and a route along which the working means model can arrive at the position of the standard part model without suffering from interference is confirmed successfully, a simulation of working to be performed for the standard part model with the working means model can be executed subsequently to confirm the working range amount.

In particular, when an actual working means such as a tool works a standard part to perform working such as assembly working, disassembly working or adjustment working of a subject, a working space other than the configuration of the tool may be required depending upon the nature of the tool model. In this instance, it is required to confirm whether or not there is such a working space around the standard part model arranged in the design model.

For example, when a model 51 of a bolt as a standard part model is to be worked using a model 52 of a spanner as seen in FIG. 14, as a working rage of the model 52 of a spanner, it is ideal to assure a working space over 360 degrees (refer to reference symbol S). However, such a situation possibly occurs that, due to interference with some other part, the working range can be assured only over a range of, for example, 240 degrees (refer to reference symbol R) or 120 degrees (refer to reference symbol Q). In this manner, the model 52 of a spanner has a nature that the workability thereof varies depending upon the magnitude of the working range.

In other words, even if a tool model can arrive at the position of a subject standard part model without any interference, it is not guaranteed that the tool model can be used appropriately. Therefore, after it is checked in steps B20 and B21 described above that the predetermined position is reached, if necessary, also checking of the workability of the tool model is performed.

It is to be noted that whether or not checking of the workability of the tool model is required may be set using the keyboard 15 or the mouse 16 or may be determined by the general controller 21 from data regarding the standard part model and/or data regarding the working means model.

Figure 12:
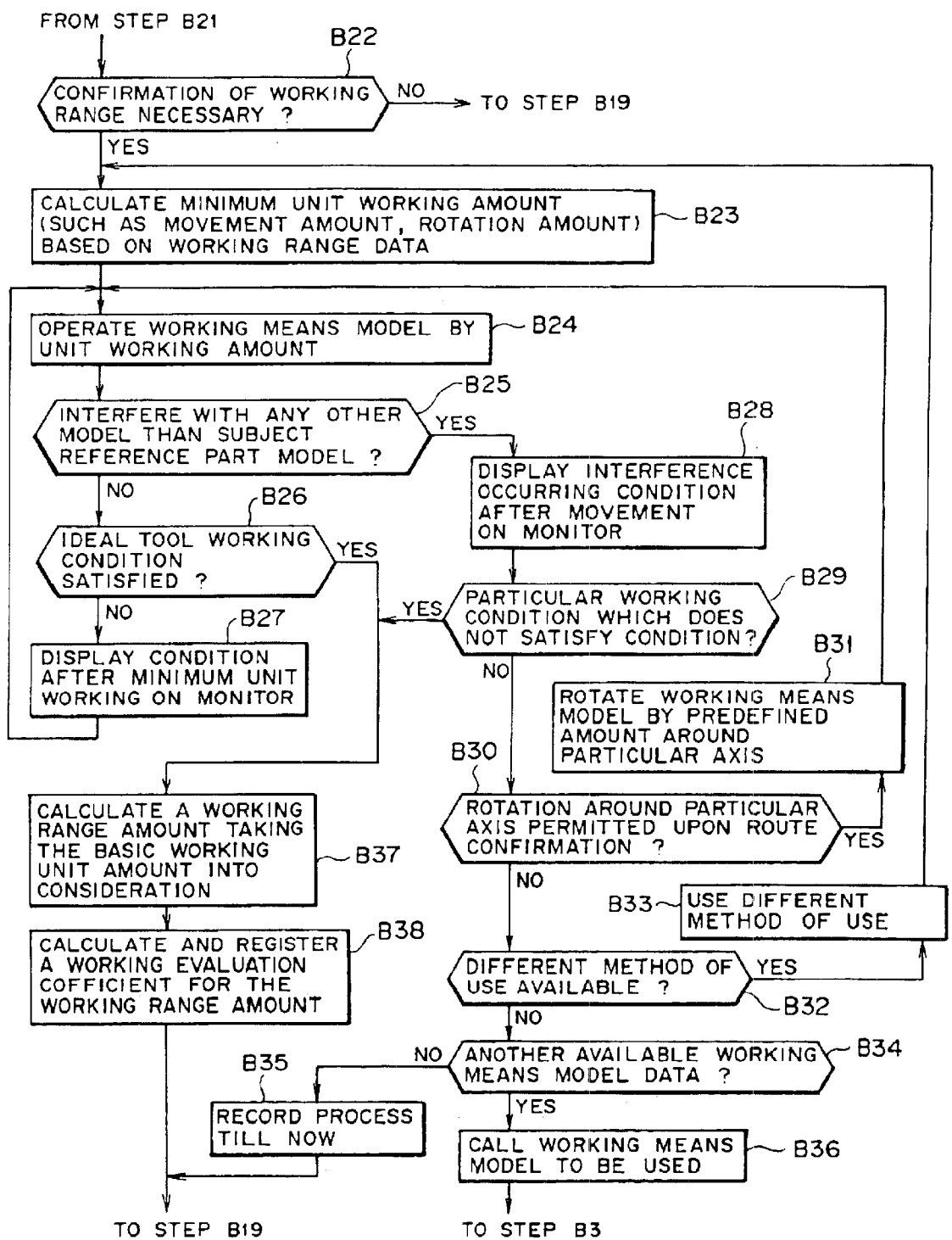

Here, if confirmation of the working range is not required when working is performed for the standard part model by the working means model as seen in FIG. 12 (the NO route of step B22), then a result of the simulation regarding the arrival route confirmation described above is reported (step B19), but if confirmation of the working range is required (the YES route of step B22), then the simulation calculation execution section 23 calculates a minimum unit working amount (movement amount, rotation amount or the like) based on the working range data (step B23).

For example, with such a model 52 of a spanner as shown in FIG. 14, the minimum working range when it works a model 51 of a bolt is a range of a turning angle of 60 degrees (refer to reference symbol P), and where the model 52 is used as a working means model, the simulation calculation execution section 23 calculates a working amount of turning motion of 60 degrees as a result of calculation of the minimum unit working amount mentioned hereinabove.

After the simulation calculation execution section 23 calculates the minimum unit working amount in this manner, the simulation calculation execution section 23 produces, by calculation, position/posture data of the position/posture after the working means model is operated by the minimum unit working amount calculated in such a manner as described above (step B24).

When the working means model is operated based on the calculation of three-dimensional CAD data by the simulation calculation execution section 23, the interference checking section 24 checks based on the three-dimensional CAD data produced by the calculation of the simulation calculation execution section 23 whether or not interference of the working means model with some other part model or standard part model occurs (step B25).

If interference of the working means model with any other model than the subject standard part model does not occur when the working means model is operated by the minimum unit working amount as described above, then the design model is displayed together with the working means model after the movement on the monitor 14. Thereafter, if interference of the working means model with some other part model does not occur, the processing of performing interference checking while the working means model is successively moved step by step by the minimum unit working amount and displaying the models after the movement on the monitor 14 is repeated in a similar manner.

In other words, until it is detected by the interference checking section 24 that interference of the working means model with any model other than the subject standard part model occurs or it is detected that a tool ideal working condition is satisfied without suffering from interference, the working means model is successively operated step by step by the minimum unit working amount described above and a manner of the movement by the working means model is displayed on the monitor 14 (the closed loop including step B24, the NO route of step B25, the NO route of step B26 and step 27).

Here, if a result of interference checking performed by the interference checking section 24 while the working means model is operated in such a manner as described above proves that interference of the working means model with any other model than the standard part model occurs, then the interference condition which occurs after the movement of the working means model is displayed on the monitor 14 under the control of the general controller 21 (from the YES route of step B25 to step B28).

In other words, when interference with the working means model occurs in the process of execution of working to be performed for the standard part model with the working means model, the monitor 14 displays the interference occurring condition.

In this instance, if a working amount with which no interference occurs has been confirmed by a working operation of the working means model performed in the virtual three-dimensional space, or in other words, if such a working condition as at least satisfies the requirement that no interference occurs even if the working means model is operated with the minimum unit working amount has been confirmed by the processing in steps B24 to B27 described above, then the simulation calculation execution section 23 calculates a working range amount over which working can be performed taking the basic working unit amount of the working means model itself into consideration (from the YES route of step B29 to step B37).

Similarly, even if no interference occurs when the working operation of the working means model is performed in the ideal working condition in the virtual three-dimensional space, the simulation calculation execution section 23 calculates a working range amount over which working can be performed taking the basic working unit amount of the working means model itself into consideration (from the YES route of step B26 to step B37).

More particularly, a model 62 of a spanner which works a model 51 of a bolt shown in FIG. 15 can work only within a range within which no interference thereof with another part model 53 occurs, and can be turned within a range of 90 degrees in the maximum (refer to an angle $\alpha$ in FIG. 15). In this instance, since the basic turning unit of the tool is 60 degrees, the simulation calculation execution section 23 can calculate a working range of 60 degrees (refer to an angle $\beta$ in FIG. 15) as the minimum unit working amount described above.

When the working range amount is calculated in such a manner as described above, the evaluation result management section 25 calculates a workability evaluation result for the working range amount and registers the workability evaluation result of the calculation into the evaluation result data storage section 13 (step B38). Then, the general controller 21 reports the process till then (for example, the result of confirmation of the arrival route of the working means model, the result of confirmation of calculation of the working range amount and the result of evaluation of the workability) as a simulation result through the printing apparatus not shown, the monitor 14 and so forth (step B19).

It is to be noted that, in this instance, the working means model whose working range amount has been confirmed is displayed on the monitor 14 such that the original arrival route is traced reversely from the position of the standard part model worked by the working means model so that the working means model is successively spaced away by a condition defined in advance (for example, by the unit movement distance mentioned hereinabove), and after the working means model is spaced away by a predefined distance from the position of the subject, the display of the working means model is erased.

Figure 16:
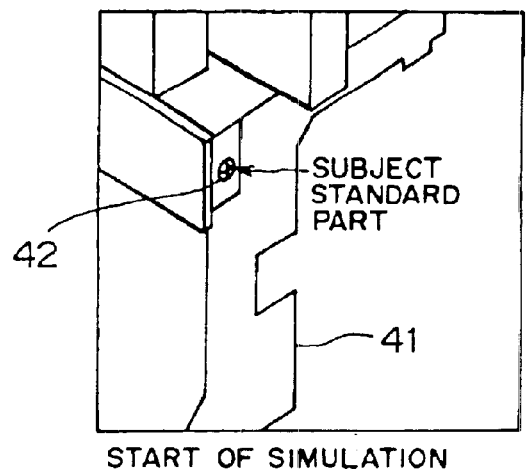
FIGS. 16 to 24 are schematic views showing different successive displaying manners displayed on a monitor as a result of simulation by the simulation apparatus of FIG. 2.
Figure 17:
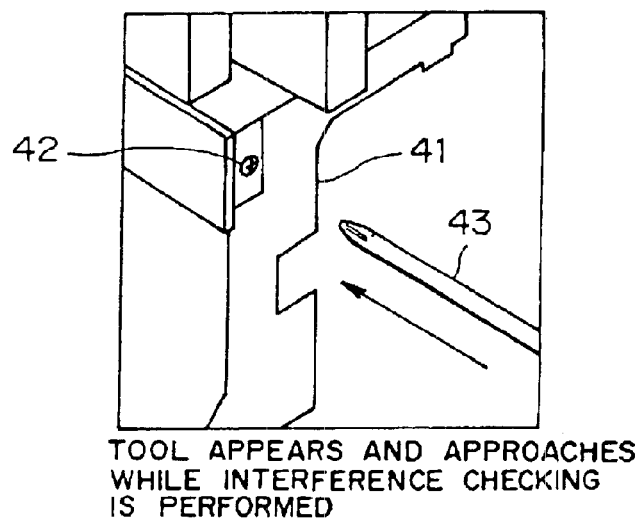
Figure 18:
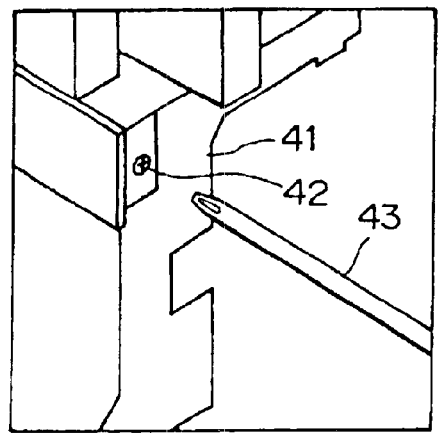

For example, if a simulation of working wherein a model 42 of a screw as a standard part model arranged on a design 41 is worked using a model 43 of a screwdriver as a working means model as seen in FIG. 16 is executed, then as a result of the simulation, such a series of manners as seen in FIGS. 17 to 24 can be displayed on the monitor 14.

Figure 19:
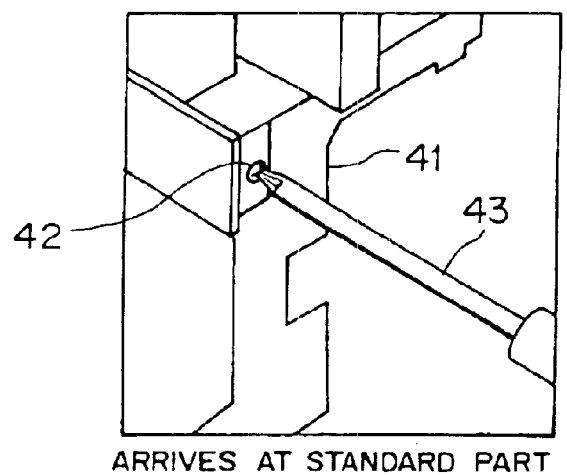

In particular, the model 43 of a screwdriver displayed as a working means model to be used to work the model 42 of a screw as a standard part model successively moves by each unit distance along the calculated route for arrival route confirmation (refer to FIG. 17 to FIG. 18, or FIG. 18 to FIG. 19) until it reaches the position of the model 42 of a screw (refer to FIG. 19).

Figure 20:
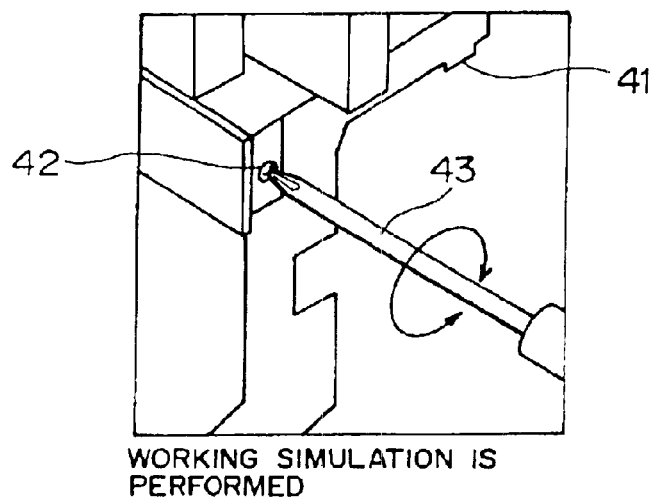

Here, in order to perform confirmation of a working range, a simulation of working of the model 42 of a screw with the model 43 of a screwdriver is performed subsequently to confirm a working range amount necessary for the working with the working means model (FIG. 20).

In other words, the monitor 14 displays, as an execution process of the simulation of working, a process until the model 43 of a screwdriver arrives at the model 42 of a screw which provides a subject position and a manner of working which is performed by the model 43 of a screwdriver based on a condition defined in advance.

Figure 21:
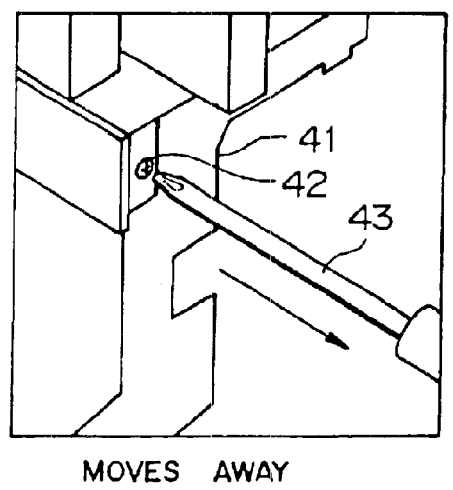
Figure 22:
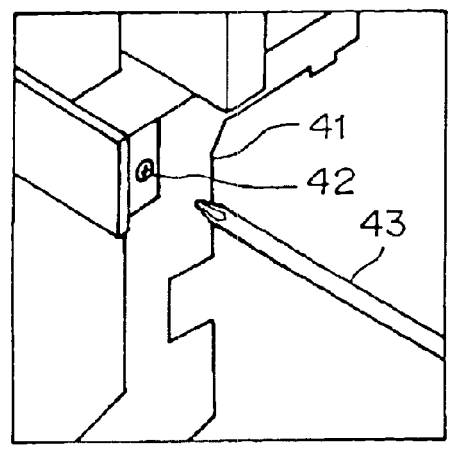
Figure 23:
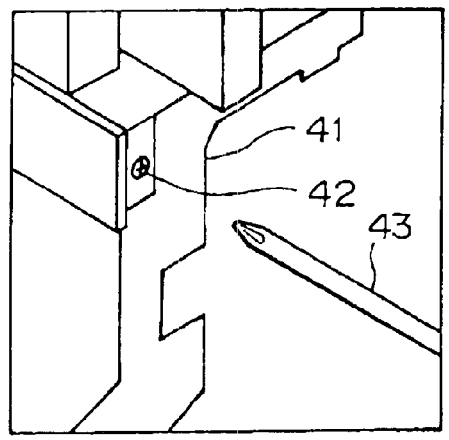
Figure 24:
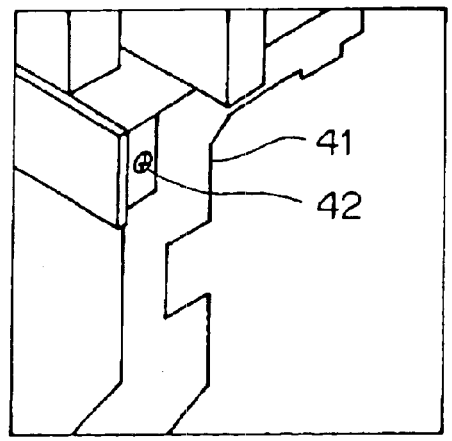

After the working is completed, the model 43 of a screwdriver moves away from the position of the model 42 of a screw tracing the original route (FIGS. 21 to 23). After the model 43 of a screwdriver moves by a predetermined distance away from the position of the model 42 of a screw, the display of the model 43 is erased (FIG. 24).

In other words, after working performed by the model 43 of a screwdriver based on the condition defined in advance is completed, the monitor 14 first displays that the model 43 of a screwdriver moves away from the model 42 of a screw as the subject position based on the condition defined in advance for the model 42 of a screw, and then erases the display of the model 43 of a screwdriver after the model 43 of a screwdriver moves by the predefined value away from the subject position.

It is to be noted that, in this instance, if a simulation of working to remove the model 42 of a screw with the model 43 of a screwdriver is performed, then the display of the model 43 of a screwdriver and the model 42 of a screw is erased after the model 43 of a screwdriver moves by the predefined distance away from the subject position.

By the way, if, upon working by the working means model described above, interference occurs upon movement of the working means model by the minimum unit working amount and the particular condition which satisfies the requirement is not reached (the NO route of step B29), then if rotation of the working means model around a particular axis is permitted upon route confirmation (the YES route of step B30), then the simulation calculation execution section 23 produces, by calculation, position/posture data for rotating the working means model around the particular axis, and interference checking is performed while the working means model is operated in a similar manner as described above (from step B31 to step B24).

In particular, for example, for the model 51 of a bolt which is worked by such a model 52 of a spanner as described hereinabove with reference to FIG. 14, it is necessary to confirm a plurality of positional relationships to the model 52 of a spanner as a working means model. This is because, for example, even if interference occurs when the reference position of the model 51 of a bolt and the reference position of the model 52 of a spanner are adjusted to each other, interference does not sometimes occur when the model 52 of a spanner is in a positional relationship turned by 60 degrees.

Further, even if rotation of the working means model around the particular axis is not permitted upon route confirmation described above (the NO route of step B30), if the working means model has another available method of use (the YES route of step B32), the reference position according to the available method of use is used to calculate a minimum unit working amount newly, and interference checking is performed while the working means model is operated to perform confirmation of the working range amount (from step B33 to step B23).

Further, also when the working means model described above has no other available method of use (the NO route of step B32), if the subject standard part model has another available working means model (the YES route of step B34), then the working means model is read out by the part/tool information management section 22 and displayed on the monitor 14 so that a simulation for arrival route confirmation is executed newly (from step B36 to step B3).

When the working means model described above has no other available method of use (the NO route of step B32), if no other working means model is available (the NO route of step B34), then the general controller 21 records the process till then and reports it as a simulation result through the printing apparatus not shown or the monitor 14 (steps B35 and B19).

Accordingly, where a plurality of working means models are related to a standard part model in such a manner that, for example, as described hereinabove with reference to FIG. 5, the tool set 110A including the two drives 110A-1 and 110A-2 are related as a working means model with the standard part model 32-1, a working simulation is performed not using the two screwdrivers simultaneously, but an order in use of the two screwdrivers is determined depending upon a priority order defined in advance.

For example, if the screwdriver 110A-1 having a shorter shank in the tool set 110A shown in FIG. 5 has a higher priority order, then a simulation is executed first using the screwdriver 110A-1 having a shorter shank. If a result of the simulation reveals that interference occurs, for example, as seen in FIG. 13A and it is determined that the screwdriver 110A-1 cannot be used, then the other screwdriver 110A-2 having a longer shank in the tool set 110A of FIG. 5 is used to perform a simulation again.

If a result of the simulation reveals that no interference occurs as seen, for example, in FIG. 13B, then it is determined that assembly of the standard part model 32-1 as a fastening part is possible, and this is displayed on the monitor 14. Further, a result of workability evaluation calculated by the evaluation result management section 25 where the longer screwdriver 110A-2 having a lower priority degree is stored into the evaluation result data storage section 13.

While examples of operation of a working simulation of a working means model where principally a tool model such as a screwdriver or a hexagon wrench is used as the working means model are described in detail above with reference to FIGS. 11 and 12, a working simulation similar to that described above can be performed also in a case wherein working is performed for a standard part model using a model of a hand of a human being.

In particular, when working is performed for a standard part model by a hand of a worker itself, the hand of the worker is set to a working means model, and a simulation of working can be executed to confirm a relative magnitude of the working means model relative to the other part models, a working range or a working method.

In this instance, that a standard part model is related to information of a plurality of tool models corresponds to that the standard part model is related to hand models of different sizes, and that a tool model possibly has a plurality of methods of use corresponds to that a hand model has a plurality of available methods of use such as grasping and nipping.

In this instance, when the execution process of the simulation of the working is displayed in the virtual three-dimensional space on the monitor 14, the working means model having a shape suitable for its object of use is displayed in the virtual three-dimensional space.

For example, if a simulation of working wherein a hand model 62 as a working means model is used for a standard part model 61 arranged on a design model to grasp and pull the standard part model 61 is executed in a similar manner as described above, then such forms as shown in FIGS. 25 to 30 are displayed as a result of the simulation on the monitor 14.

Figure 25:
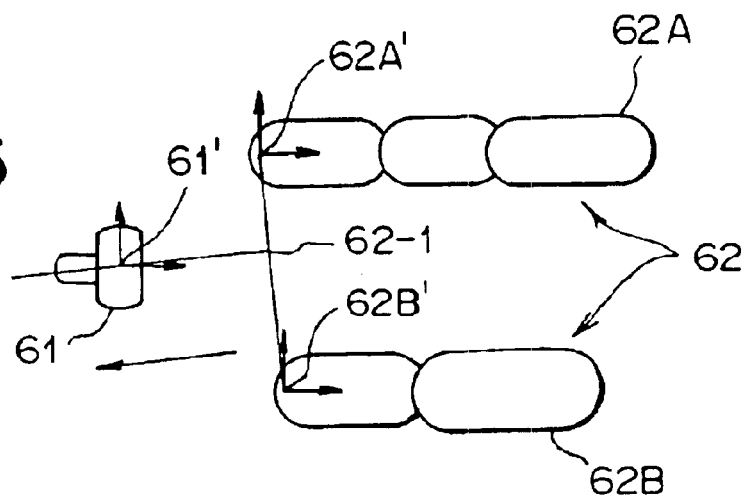
FIGS. 25 to 32 are schematic views showing different successive displaying manners displayed on the monitor as a result of simulation by the simulation apparatus of FIG. 2.

In particular, in order to perform a simulation wherein the standard part model 61 having a reference position 61' is grasped and pulled using the hand model 62 displayed in such a manner as shown in FIG. 25, a middle point 62-1 between the reference position 62A' of the forefinger model 62A and the reference position 62B' of the thumb model 62B which are components of the hand model 62 is calculated.

Figure 26:
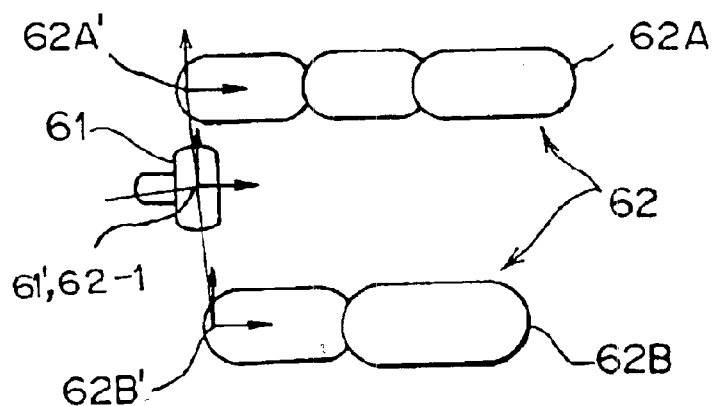

Further, the simulation calculation execution section 23 moves the hand model 62 by calculation of the three-dimensional CAD data so that the middle point 62-1 described above may approach the reference position 61' of the standard part model 61 side until the position of the middle point 62-1 comes to the reference position 61' as seen from FIGS. 25 and 26.

Figure 27:
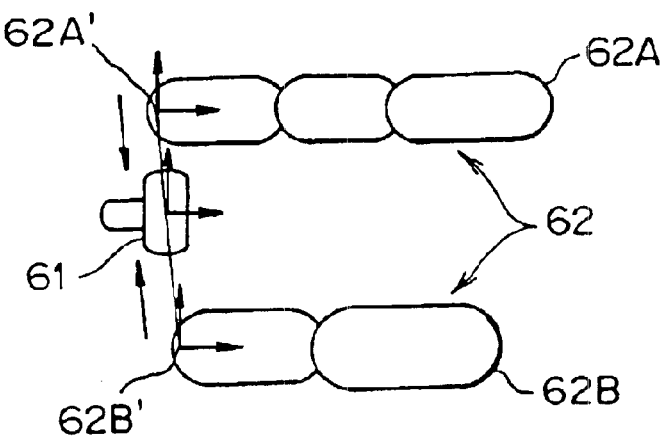
Figure 28:
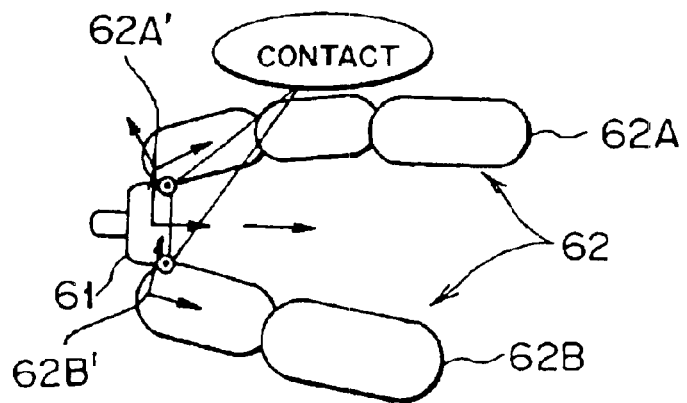

Further, the simulation calculation execution section 23 defines in advance a calculation technique of three-dimensional CAD data for performing working of the hand model 62 to grasp, and moves the reference positions 62A' and 62B' defined on the hand model 62 side toward the reference position of the standard part model 61 as seen in FIG. 27 (refer to the closed loop of steps B7 to B11 of FIG. 11).

It is to be noted that, when a working means model having a movable portion like the hand model 62 is moved nearer, position/posture data can be produced using, for example, a technique of inverse kinematics.

Further, if, in the process wherein the reference positions 62A' and 62B' of the hand model 62 are moved toward the reference position of the standard part model 61, interference occurs between the forefinger model 62A and the standard part model 61 and between the thumb model 62B and the standard part model 61 without causing interference between the hand model 62 and any other model than the standard part model 61, then an arrival route until the hand model 62 described above grasps the standard part model 61 can be confirmed (refer to steps B20 and B21 of FIG. 11).

Figure 29:
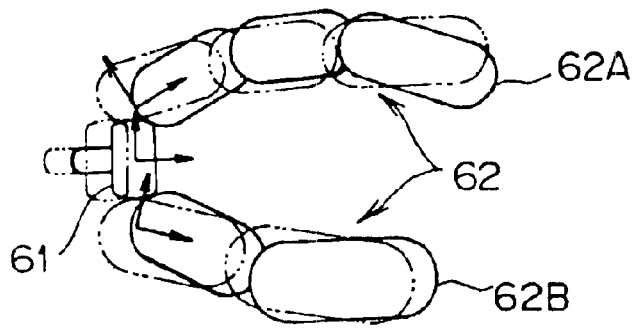
Figure 30:
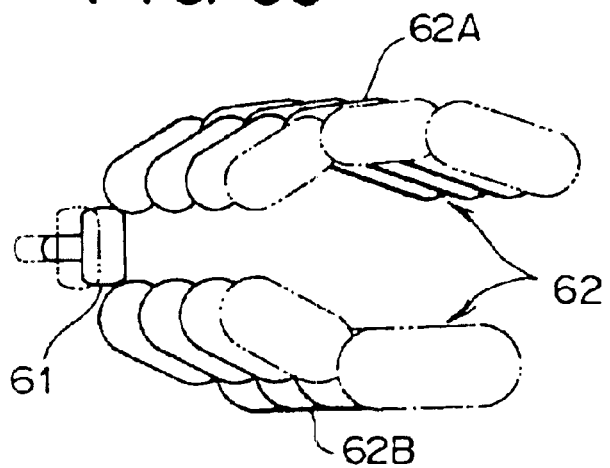

Further, by pulling the standard part model 61 while the standard part model 61 is grasped by the hand model 62 as seen in FIG. 29, a working range amount can be confirmed. Then, when the position of the hand model 62 is spaced away by the prescribed distance from the original position of the standard part model 61 as seen in FIG. 30, the display of the hand model 62 on the monitor 14 can be erased.

It is to be noted that the predefined value for erasing such a working means model displayed on the monitor 14 as described above can be determined from a relationship between a constant stored in the actual model data storage section 11 depending upon the working means model and a manner of use of the working means model and the size of a parallelepiped or spherical member or a like member which contains the subject standard part model and other design subject data present in the virtual three-dimensional space.

Figure 31:
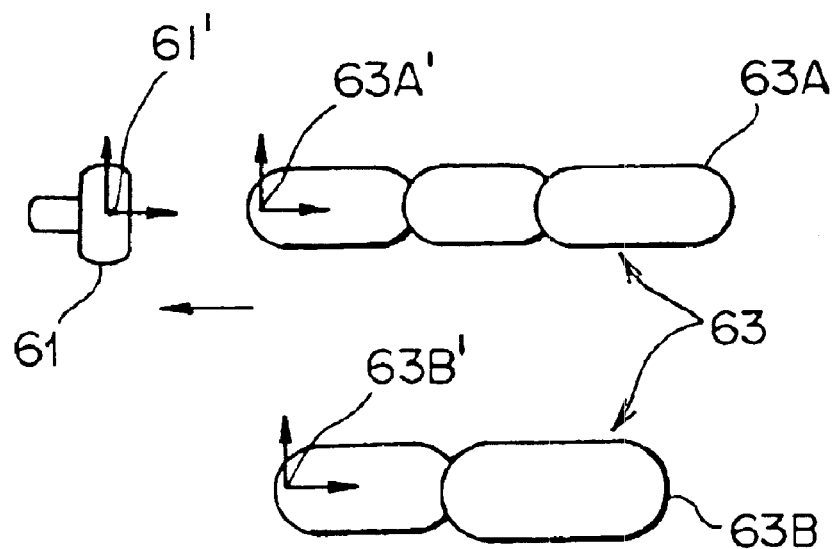
Figure 32:
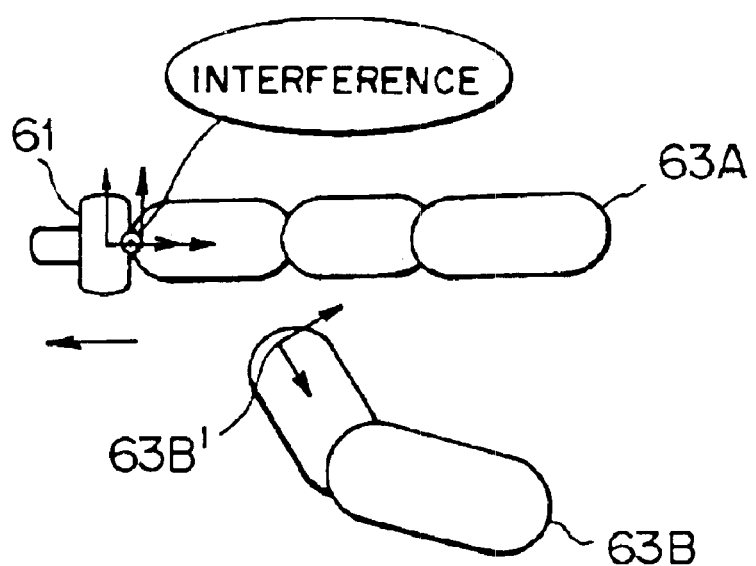

Also when a hand model 63 as a working means model performs a simulation of working to push the standard part model 61, the simulation apparatus 10 performs basically similar processing to that for the working simulation with a tool model described above and the monitor 14 can display a process of the working simulation in such a manner as seen in FIGS. 31 and 32.

In particular, the simulation calculation execution section 23 defines in advance a calculation technique of three-dimensional CAD data for the hand model 63 to push a standard part model as shown in FIGS. 31 and 32 so that the working of folding a thumb model 63B having a reference position 63B' and pushing the standard part model 61 with a forefinger model 63A having a reference position 63A' can be regenerated in the virtual three-dimensional space.

It is to be noted that, when a working simulation is performed using the hand model described above as a working means model, shape data corresponding to various working manners such as grasping and pulling, pushing and gripping are stored in the actual model data storage section 11 so that suitable shape data (or size data) of the hand model can be selectively used from among the stored working manners in accordance with a working manner used.

In this instance, it may be possible, for example, to use data only of a finger tip as model data, to use data of a hand from the finger tips to the wrist as model data or to use the hand from the finger tips to the forehand as model data.

Figure 33:
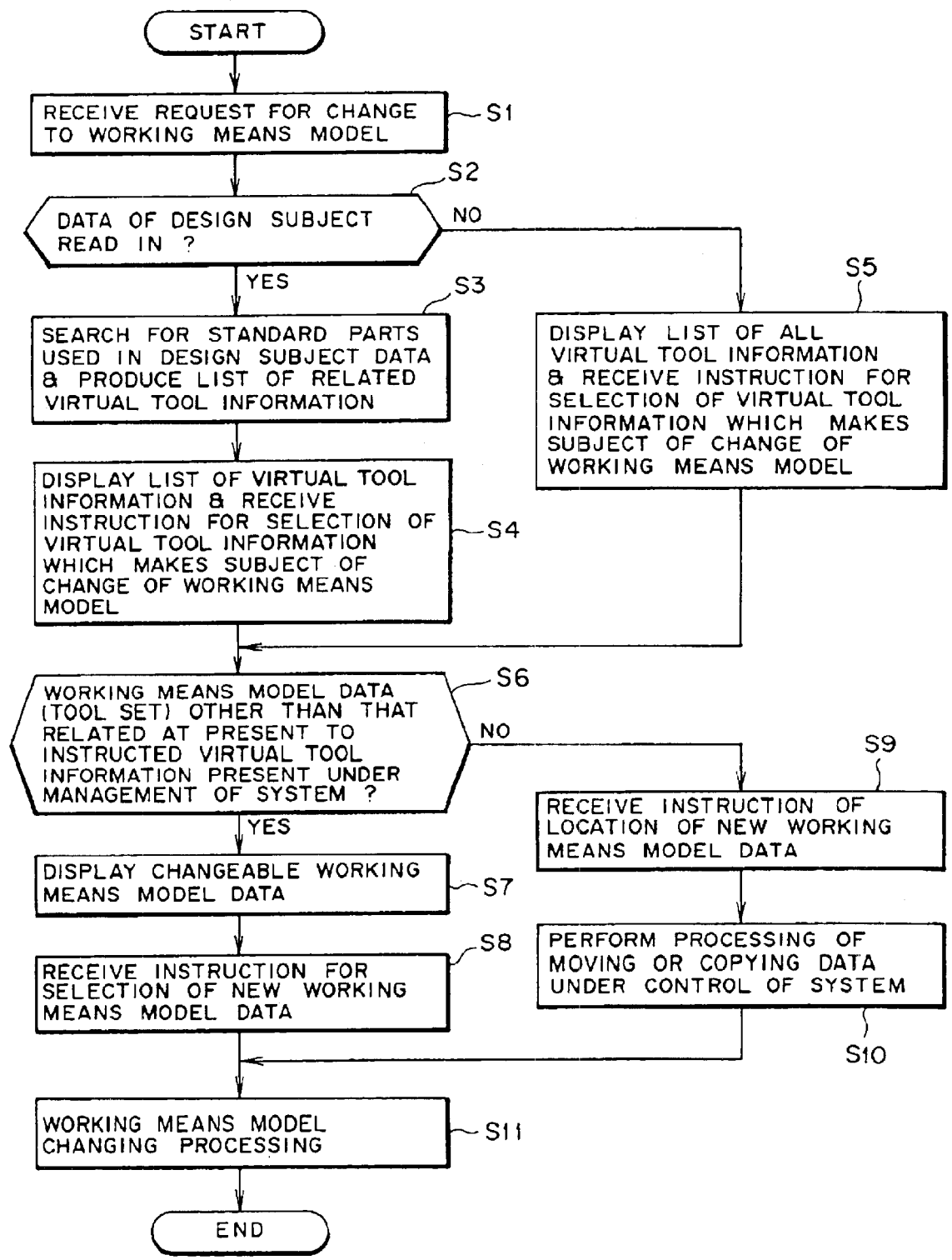
FIG. 33 is a flow chart illustrating a manner of changing information regarding working means models (actual models) stored in the actual model data storage section of the simulation apparatus of FIG. 2.

The information regarding the working means models (actual models) stored in the actual model data storage section 11 of the simulation apparatus 10 in the present embodiment can be modified suitably, for example, in accordance with a flow chart of FIG. 33 in response to an operation of the keyboard 15 or the mouse 16.

First, if the general controller 21 of the simulation apparatus 10 receives an instruction based on an operation of the keyboard 15 or the mouse 16 to change the information regarding a working means model stored in the actual model data storage section 11 (step S1), then it displays virtual tool information as attribute information so that it may receive a selection instruction of the virtual tool information which makes a subject of the change.

In particular, if data (design data) of a design model which makes a subject of the simulation has already been read in (the YES route of step S2), then the general controller 21 controls the monitor 14 so that attribute information of working means models to be used to work all standard part models used in the design model may be displayed as virtual tool information in the form of a list on the monitor 14 (step S3) and receives a selection instruction of the virtual tool information which makes a subject of the change (step S4).

On the other hand, when data of the design model which makes a subject of the simulation has not been read in as yet (the NO route of step S2), then the general controller 21 controls the monitor 14 so that all attribute information regarding the working means models stored in the actual model data storage section 11 may be displayed as virtual tool information in the form of a list on the monitor 14 and receives a selection instruction of the virtual tool information which makes a subject of the change (step S5).

Then, if a working means model or models other than working means models related at present to the virtual tool information designated as a subject of the modification in step S4 or S5 described above are present under the control of the system (the YES route of step S6), then the general controller 21 controls the monitor 14 to display those working means models which can be changed under the control of the system (step S7) and receives a selection instruction of a working means model to be related newly (step S8).

On the other hand, if no working means model other than working means models related at present to the virtual tool information designated as a subject of the change is present under the control of the system (the NO route of step S6), then the general controller 21 receives an instruction of a location of the working means model to be related newly (step S9) and then performs processing of moving or copying the data under the control of the system (step S10).

Then, new relating operation of the virtual tool information described above to the working means model selectively designated in step S8 or S9 as described above is performed (step S11).

In this manner, with the simulation apparatus 10 according to the present embodiment, as information regarding the working means models stored in the actual model data storage section 11 and the standard part models are related to each other by coordination of attribute information, a working means model related to a standard part model used upon designing of a design model can be acquired rapidly and a simulation of working to be performed for the standard part model can be executed using the acquired working means model. Consequently, during designing of an apparatus/equipment model in which a three-dimensional CAD system is used, there is no need of registering information regarding an actual tool into design data themselves in advance. Consequently, there is an advantage that the efficiency of modeling operation by a three-dimensional CAD system can be improved.

Further, even if, during designing of an apparatus/equipment model in which a three-dimensional CAD system is used, design data are produced without performing such working as retrieval or relating operation of part models, since a simulation of working for standard part models arranged in the design data can be executed, a simulation can be performed also at an initial stage or in the source of designing. Consequently, there is an advantage that a simulation can be performed in the further upstream designing stage and leakage of interference checking of an apparatus or equipment after completion of designing can be prevented.

Since the workability can be verified without imposing an unnecessary designing time upon a designer through reduction of the frequency of doing over again of a part shape changing work or an assembling work of a three-dimensional CAD model, which provides a high working load, such as, for example, modification to a metal mold or variation of a shape of an actual part necessitated from a design change, the working efficiency can be raised remarkably.

Further, since notice is taken of standard parts, there is no need of updating a database or tables regarding working means models or standard part models for each design subject, and the load of preparations to a person who performs a simulation is reduced.

Furthermore, since attribute information of a working means model to be used to work can be included in information regarding a standard part model, even where the actual working means model is different because of a difference, for example, of an assembly line or a factory, there is no need of varying simulation conditions other than design data and the working means model, and the man-hours necessary for simulation working are reduced significantly. This provides another advantage that, since it is not necessary for the system to always store information regarding a large number of working means models, a simulation can be performed with a smaller amount of computer resources.

Further, since information regarding the working means models stored in the actual model data storage section 11 includes reference position information of the working means model side when a working means model works a standard part model and design information of a design model includes reference position information of the standard part model side when the working means model works the standard part model, it can be stored what tool is used in what positional relationship to the standard part model, and there is no need of getting aware of a type of a tool model to be used upon execution of a simulation or a positional relationship of the tool model to the standard part model and an efficient simulation operation can be performed simply. This also contributes to improvement in quality of a design subject.

In particular, while it matters whether or not a tool can arrive at a subject article and, even if it can arrive, it is important that it can arrive by a simple method, with the simulation apparatus 10 according to the present embodiment, cumbersome position designation for confirming the above on a computer can be eliminated.

Further, although the actual workability is different whether a standard tool is used or a special tool is used or where the same tool is used in a different manner, the workability can be evaluated while taking such a difference in workability into consideration. Consequently, there is an advantage that evaluation of the workability can be made further conform to real working.

It is to be noted that the present invention is not limited to the embodiment described above and can be carried out in various forms without departing from the scope and spirit of the present invention.

Figure 34:
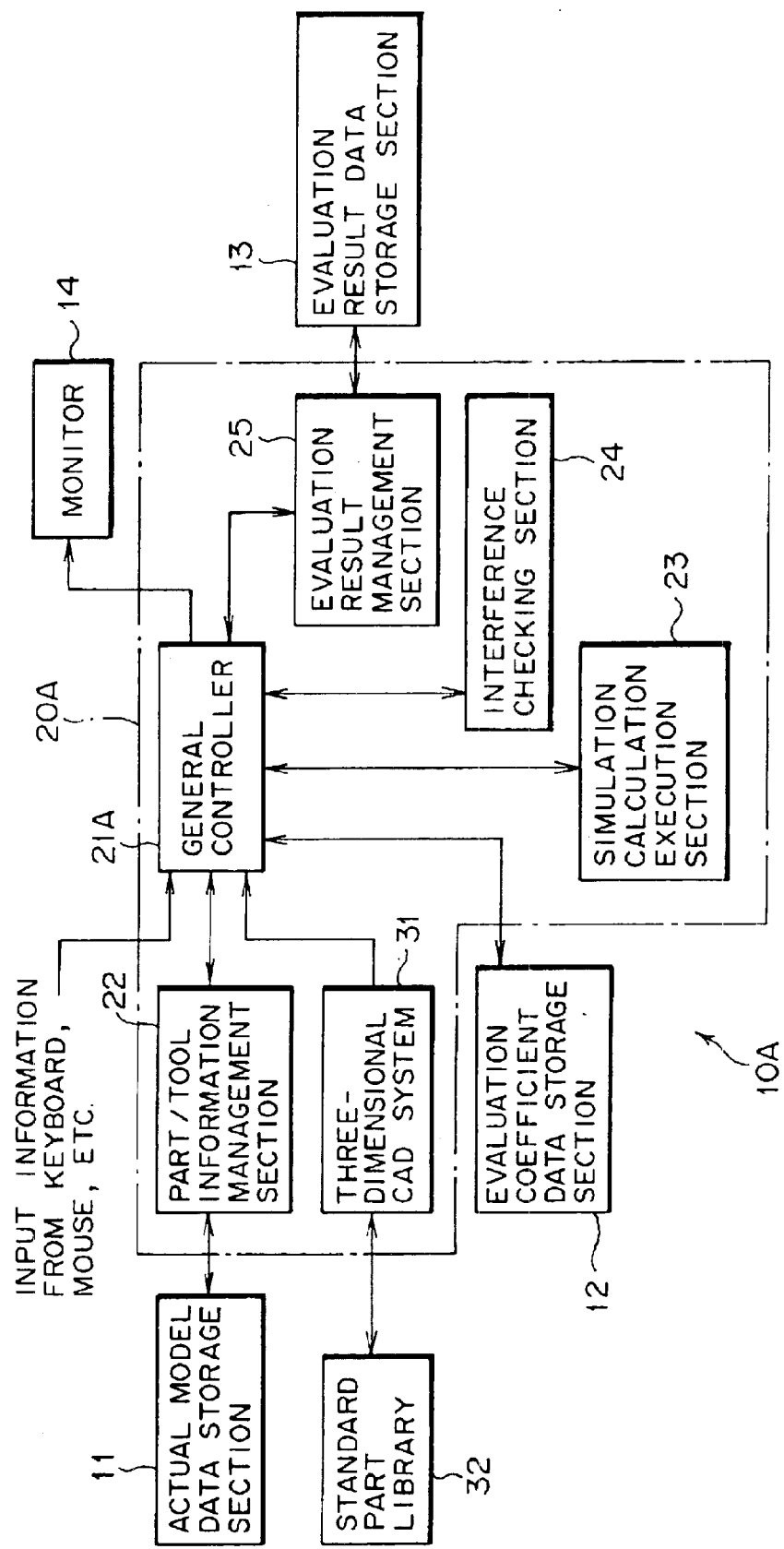
FIG. 34 is a functional block diagram showing a computer as a designing supporting apparatus according to another embodiment of the present invention.

For example, as seen in FIG. 34, a single computer 10A may have the functions of the computer 30 as a designing supporting apparatus (including the functions of the three-dimensional CAD system 31 and the standard part library 32) and the functions as the simulation apparatus 10 in the embodiment described above.

In this instance, the computer 10A includes, as hardware components thereof, as seen in FIG. 35, an actual model data storage section 11, an evaluation coefficient data storage section 12, an evaluation result data storage section 13, a monitor 14, a keyboard 15 and a mouse 16 similar to those in the embodiment described above, and further includes a processing unit 20A and a standard part library 32.

The processing unit 20A includes a part/tool information management section 22, a simulation calculation execution section 23, an interference checking section 24 and an evaluation result management section 25 similar to those in the embodiment described above, and further includes a general controller 21A and a three-dimensional CAD system 31 (refer to FIG. 34).

The general controller 21A may perform memory accessing to acquire three-dimensional CAD data produced by the three-dimensional CAD system 31 as design data for executing a working simulation.

In the computer 10A having such a construction as described above, design data designed by the three-dimensional CAD system 31 can be delivered to the general controller 21 or the simulation calculation execution section 23 on a memory (not shown) without converting them into a file. Consequently, similar advantages to those of the embodiment described above can be achieved.

Further, the simulation processing which is performed subsequently in the embodiment described above when arrival route confirmation of a working simulation or confirmation of a working range amount proves that interference of a working means model with any other part model than a standard part model occurs is not limited to such simulation processing as described hereinabove with reference to FIGS. 11 and 12, and one of a process of searching for another route, another process of searching for another tool or a further process of searching for a different manner of use may be selectively performed.

Further, while, in the embodiment described above, where a tool is used to work a standard part model, only the tool is displayed as a working means model, the manner of display is not limited to this, and a tool and a hand of a worker who uses the tool may be determined as a working means model to execute a simulation of working in order to confirm the magnitude, working range or working method of the working means model. According to this, a simulation which takes also a working space of the hand of the worker who uses the tool into consideration can be performed when compared with the case of the embodiment described above. Consequently, a simulation can be made further conform to actual working.

What is claimed is:

1. A simulation apparatus for simulating, based on design information of a design model designed in a virtual three-dimensional space while one or more standard part models standardized in advance based on a specification model are arranged in the design modal, working of a working means model to be used for the one or more standard part models arranged in the design model, comprising:

a working means model information storage section for storing working means model information which indicates details of the working means model to be used in working the one or more standard part models, said working means model information being linked with standard part model information which indicates details of the one or more standard part models;

a working means model information extraction section for automatically referring, based on information regarding the standard part models arranged in a design model, to said working means model information storage section to extract information regarding a working means model to be used to work the standard part models arranged in the design model; and a working simulation execution section for executing a three-dimensional simulation of the working of one of the standard part models with the working means model based on design information of the design model and the information regarding the working means model extracted by said working means model information extraction section, where the working means model is automatically selected from among plural other working means models pre-associated with the one standard part model based on an automatic determination according to a result of the simulation that it satisfies a working condition of the working means model.

2. A simulation apparatus as claimed in claim 1, wherein the information regarding the standard part models arranged in the design model include attribute information of the working means modal related to the standard part models, and said working means model information extraction section refers to said working means model information storage section based on the attribute information to extract the information regarding the working means model.

3. A simulation apparatus as claimed in claim 1, wherein said working means model information storage section stores information of one or more tool models which are models of actual tools and/or a hand model which is a model of a hand of a worker as the information regarding the working means model.

4. A simulation apparatus as claimed in claim 1, wherein the information regarding the working means model stored in said working means model information storage section includes reference position information of the working means model when the working means model works the standard part models while the design information of the design model includes reference position information of the standard part models when the working means model works the standard part models, and said working simulation execution section performs a simulation of a relationship in position/posture of the working means model to the standard part models based on the reference position information of the working means model and the standard part models.

5. A simulation apparatus as claimed in claim 1, further comprising an interference checking section for checking interference of the working means model while said working simulation execution section executes a simulation of the working of the standard part models with the working means model.

6. A simulation apparatus as claimed in claim 5, wherein said interference checking section checks interference of the working means model including a route along which the working means model arrives at one of the standard part models when the standard part model arranged in the design model is worked using the working means model.

7. A simulation apparatus as claimed in claim 2, further comprising a workability evaluation section for evaluating workability based on a result of execution of the working simulation by said working simulation execution section and also based on information of the attribute of the working means model, where the workability indicates whether or an extent to which the working means model is able to work the one or more standard part models.

8. A simulation apparatus as claimed in claim 1, wherein said working means model information storage section stores information regarding a working condition necessary for working of the working means model as information regarding the working means model, and said working simulation execution section executes a working simulation based on the information regarding the working condition of the corresponding working means model stored in said working means model information storage section.

9. A simulation apparatus for simulating, based on design information of a design model designed in a virtual three-dimensional space while one or more standard part models standardized in advance based on a specification model are arranged in the design model, working of the standard part models arranged in the design model, comprising:

a working means model information storage section for storing working means model information which indicates details of a working means model to be used in working the one or more standard part models, said working means model information being linked before simulating of the apparatus with standard part model information which indicates details of the one or more standard part models;

a working means model information extraction section for automatically referring, based on information regarding the standard part models arranged in a design model, to said working means model information storage section to extract information regarding a working means model to be used to work the standard part models arranged in the design model; and a working simulation execution section for executing a simulation of the working of one of the standard part models with the working means model based on design information of the design model and the information regarding the working means model extracted by said working means model information extraction section; wherein said working means model information storage section stores information regarding a working condition necessary for working of the working means model as information regarding the working means model, and said working simulation execution section executes a working simulation based on the information regarding the working condition of the corresponding working means model stored in said working means model information storage section; wherein said working means model information storage section stores information regarding working spaces necessary for working of the working means models as the information regarding the working conditions of the individual working means model, where the working means model is automatically selected from among plural other working means models pre-associated with the one standard part model based on an automatic determination according to the simulation that it satisfies a working condition of the working means model.

10. A simulation apparatus for simulating, based on design information of a design model designed in a virtual three-dimensional space while one or more standard part models standardized in advance based on a specification model are arranged in the design model, working of the standard part models arranged in the design model, comprising:

a working means model information storage section for storing working means model information which indicates details of a working means model to be used in working the one or more standard part models, said working means model information being linked with standard part model information which indicates details of the one or more standard part models;

a working means model information extraction section for automatically referring, based on information regarding the standard part models arranged in a design model, to said working means model information storage section to extract information regarding a working means model to be used to work the standard part models arranged in the design model; and a working simulation execution section for executing a three-dimensional simulation of the working of the standard part models with the working means model based on design information of the design model and the information regarding the working means model extracted by said working means model information extraction section; wherein the information regarding the working means model stored in said working means model information storage section includes reference position information of the working means model when the working means model works the standard part models while the design information of the design model includes reference position information of the standard part models when the working means model works the standard part models, and said working simulation execution section performs a simulation of a relationship in position/posture of the working means model to the standard part models based on the reference position information of the working means model and the standard part models; wherein said working means model information storage section stores information of a plurality of reference positions for any working means model which allows operation thereof in a plurality of different methods, and said working simulation execution section executes a working simulation according to the plurality of operation methods, where result of the execution of the working simulation is used to automatically select the working means model from among plural other working means models pre-associated with the standard part models.

11. A simulation apparatus for simulating, based on design information of a design model designed in a virtual three-dimensional space while one or more standard part models standardized in advance based on a specification model are arranged in the design model, working of a working means model to be used for the one or more standard part models arranged in the design model, comprising:

a working means model information storage section for storing working means model information which indicates details of the working means model to be used in working the one or more standard part models, said working means model information being linked with standard part model information which indicates details of the one or more standard part models;

a working means model information extraction section for automatically referring, based on information regarding the standard part models arranged in a design model, to said working means model information storage section to extract information regarding a working means model to be used to work the standard part models arranged in the design model;

a working simulation execution section for executing a simulation of the working of one of the standard part models with the working means model based on design information of the design model and the information regarding the working means model extracted by said working means model information extraction section, wherein the information regarding the standard part models arranged in the design model include attribute information of the working means model related to the standard part models, and said working means model information extraction section refers to said working means model information storage section based on the attribute information to extract the information regarding the working means model; and a workability evaluation section for evaluating workability based on a result of execution of the working simulation by said working simulation execution section and also based on information of the attribute of the working means model, where the workability indicates whether or an extent to which the working means model is able to work the one or more standard part models; and wherein said working means model information storage section stores information of a plurality of reference positions for any working means model which allows operation thereof in a plurality of different methods and said working simulation execution section executes a working simulation according to the plurality of operation methods while evaluating a workability for each of the operation methods of the working means model, and said workability evaluation section evaluates the workability of the working means model for the each of the working methods based on a result of execution of the working simulation according to the working method and also based on the information of the attribute, where the workability indicates whether or an extent to which the working means model is able to work the one or more standard part models.

12. A simulation apparatus as claimed in claim 1, wherein at least one of a fastening part model, an adjustment part model and a connector part model is used for the standard part models.

13. A simulation method for simulating, based on data regarding a design model displayed in a virtual three-dimensional space and designed while one or more standard part models standardized in advance based on a specification model are arranged in the design model, workability according to a working means model used to work the standard part models arranged in the design model, comprising:

providing working means model information, which indicates details of a working means model to be used in working the one or more standard part models, and standard part model information, which indicates details of the one or more standard part models, said working means model information being linked before simulating of the method with said standard part model information;

automatically acquiring the working means model, which is to be used in working the individual standard part model, based on said working means model information being linked with said standard part model information that indicates the details of the individual standard part model;

executing a simulation of working to be performed for the standard part models using the acquired working means model; and displaying a process of the execution of the simulation in a virtual three-dimensional space, where the working means model is automatically selected from among plural other working means models pre-associated with the standard part models based on an automatic determination as a result of the simulation that it satisfies a working condition of the working means model.

14. A simulation method as claimed in claim 13, wherein, as the simulation of the working to be performed for the standard part models, a simulation of at least one kind of working from among assembling working, disassembling working, adjustment working and maintenance working of the standard part models is performed.

15. A simulation method as claimed in claim 13, wherein, where a tool is used to work the standard part models, the tool and a hand of a worker who uses the tool are used as the working means model to perform the simulation of the working.

16. A simulation method as claimed in claim 13, wherein, where the standard part models are to be worked by a hand of a worker itself, the hand of the worker is used as the working means model to perform the simulation of the working.

17. A simulation method as claimed in claim 15, wherein, when the process of execution of the simulation of the working is displayed in the virtual three-dimensional space, the working means model is displayed in a shape suitable for an object of use in the virtual three-dimensional space.

18. A simulation method as claimed in claim 16, wherein, when the process of execution of the simulation of the working is displayed in the virtual three-dimensional space, the working means model is displayed in a shape suitable for an object of use in the virtual three-dimensional space.

19. A simulation method as claimed in claim 13, wherein a process through which the working means model arrives at one of the standard part models which provides a subject position and a manner of working performed based on a condition defined in advance for the working means model are displayed as the process of execution of the simulation of the working.

20. A simulation method as claimed in claim 19, wherein, after the working performed based on the condition defined in advance for the working means model is completed, a process through which the working means model is spaced away from the subject position based on a condition defined in advance for the standard part models is displayed, and after the working means model is spaced by a predefined distance away from the subject position, the display of the working means model or the working means model and the standard part models is erased.

21. A simulation method as claimed in claim 13, wherein, when interference occurs with the working means model in a process of execution of the working to be performed for the standard part models with the working means model, an occurrence condition of the interference is displayed.

22. A computer-readable recording medium having a simulation program recorded thereon for causing, in order to cause a computer to execute, based on design information of a design model designed in a virtual three-dimensional space while one or more standardized standard part models are arranged in the design model, a simulation of working of a working means model used to work the standard part models arranged in the design model, the computer to implement:

a function of providing working means model information, which indicates details of a working means model to be used in working the one or more standard part models, and standard part model information, which indicates details of the one or more standard part models, said working means model information being linked with said standard part model information;

a function of automatically acquiring said working means model information, which is to be linked with the working means model to be used in working the individual standard part models used upon designing of a design model;

a function of executing a simulation of working of one of the standard part models based on the acquired information of the working means model; and a function of displaying a process of the execution of the simulation in a virtual three-dimensional space, where the working means model is automatically selected from among plural other working means models pre-associated with the one standard part model based on an automatic determination according to the simulation that it satisfies a working condition of the working means model.

23. A designing supporting apparatus, comprising:

a standard part model information storage section for storing standard part model information regarding one or more standard part models standardized in advance based on a predetermined specification model; and a designing supporting section for arranging one or more standard part models to perform supporting for designing a subject in a virtual three-dimensional space;

said designing supporting section including an attribute information extraction section for referring to said standard part model information storage section to automatically extract attribute information of a working means model to be used to work the standard part models arranged in the subject designed in the virtual three-dimensional space, and a design data outputting section for outputting data regarding the subject designed in the virtual three-dimensional space and data regarding the attribute information extracted by said attribute information extraction section as design data, said attribute information including working means model information, which indicates details of a working means model to be used in working the one or more standard part models and which is linked with said standard part model information, where the working means model is automatically selected from among plural other working means models pre-associated with the standard part models based on an automatic determination according to a result of a three-dimensional simulation of it working a standard part model that it satisfies a working condition of the working means model.

24. An apparatus for simulating work upon a model, comprising:

a design model comprised of a standard part model;

a working means model, separate from the design model, of a type generally capable of mating with the standard part model, and having working requirements information for working the standard part model in a virtual three-dimensional space when mated with the standard part model;

arrangement information describing an arrangement of the working means model when it is arranged to be mated with the standard part model; and a processing unit simulating three-dimensional working of the standard part model by the working means model to automatically determine whether or an extent to which the arranged working means model can work the standard part model according to the arrangement information, the working requirements of the working means model, and according to the design model, where the working means model is automatically selected from among plural other working means models pre-associated with the standard part models based on an automatic determination according to the simulation that it satisfies a working condition of the working means model.

25. The apparatus according to claim 24, wherein the processing unit also automatically determines whether the working means model can be routed through the virtual three-dimensional space to its mated arrangement without interference between the moving working means model and the design model.

26. An apparatus according to claim 1, wherein the automatic determination is made by, for a particular standard part model, automatically simulating a working of the particular standard part model by two or more particular working means models, where the simulating is done with reference to a working condition of each particular working means model, and where the particular working means models are automatically selected for simulation, based on their pre-association with the particular standard part model.

* * * * *

UNITED STATES PATENT AND TRADEMARK OFFICE
CERTIFICATE OF CORRECTION

PATENT NO. : 6,901,356 B1
DATED : May 31, 2005
INVENTOR(S) : Yuichi Arita

It is certified that error appears in the above-identified patent and that said Letters Patent is hereby corrected as shown below:

Column 31,
Lines 17 and 50, change "modal" to -- model --.

Column 38,
Line 22, after "simulation" delete ",".

Signed and Sealed this

Fourteenth Day of February, 2006

JON W. DUDAS
*Director of the United States Patent and Trademark Office*